United States Patent
Odnoblyudov et al.

(10) Patent No.: US 10,411,108 B2
(45) Date of Patent: Sep. 10, 2019

(54) VERTICAL GALLIUM NITRIDE SCHOTTKY DIODE

(71) Applicant: QROMIS, Inc., Santa Clara, CA (US)

(72) Inventors: Vladimir Odnoblyudov, Danville, CA (US); Ozgur Aktas, Pleasanton, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/936,305

(22) Filed: Mar. 26, 2018

(65) Prior Publication Data
US 2018/0286964 A1 Oct. 4, 2018

Related U.S. Application Data

(60) Provisional application No. 62/478,483, filed on Mar. 29, 2017.

(51) Int. Cl.
*H01L 29/66* (2006.01)
*H01L 29/20* (2006.01)
(Continued)

(52) U.S. Cl.
CPC ...... *H01L 29/66212* (2013.01); *H01L 21/762* (2013.01); *H01L 21/7806* (2013.01); *H01L 23/48* (2013.01); *H01L 29/0619* (2013.01); *H01L 29/0661* (2013.01); *H01L 29/2003* (2013.01); *H01L 29/207* (2013.01); *H01L 29/402* (2013.01); *H01L 29/872* (2013.01); *H01L 21/0245* (2013.01); *H01L 21/0254* (2013.01); *H01L 21/02389* (2013.01); *H01L 21/02488* (2013.01); *H01L 21/02505* (2013.01)

(58) Field of Classification Search
CPC .................................................. H01L 29/66212
See application file for complete search history.

(56) References Cited

U.S. PATENT DOCUMENTS 9,666,677 B1 * 5/2017 Raring ................. H01L 29/205
2002/0102804 A1 8/2002 Nagase et al.
(Continued)

OTHER PUBLICATIONS

International Search Report and Written Opinion of the International Searching Authority dated Jun. 21, 2018 in corresponding International Application No. PCT/US2018/024629 (twelve pages).

*Primary Examiner* — Walter H Swanson
(74) *Attorney, Agent, or Firm* — Kilpatrick Townsend & Stockton LLP

(57) ABSTRACT

A vertical Schottky diode includes an ohmic contact, a first epitaxial N-type gallium nitride layer physically contacting the ohmic contact and having a first doping concentration, and a second epitaxial N-type gallium nitride layer physically contacting the first epitaxial N-type gallium nitride layer and having a second doping concentration that is lower than the first doping concentration. The vertical Schottky diode further includes a first edge termination region and a second edge termination region coupled to the second epitaxial N-type gallium nitride layer and separated from each other by a portion of the second epitaxial N-type gallium nitride layer, and a Schottky contact coupled to the portion of the second epitaxial N-type gallium nitride layer, and to the first edge termination region and the second edge termination region.

6 Claims, 15 Drawing Sheets

(51) Int. Cl.

| | |
|---|---|
| *H01L 29/872* | (2006.01) |
| *H01L 29/207* | (2006.01) |
| *H01L 21/78* | (2006.01) |
| *H01L 21/762* | (2006.01) |
| *H01L 23/48* | (2006.01) |
| *H01L 29/40* | (2006.01) |
| *H01L 29/06* | (2006.01) |
| *H01L 21/02* | (2006.01) |

(56) References Cited

U.S. PATENT DOCUMENTS

| | | |
|---|---|---|
| 2008/0050876 A1 | 2/2008 | Matocha et al. |
| 2009/0243026 A1* | 10/2009 | Nakamura ............... H01L 29/47 257/471 |
| 2013/0126888 A1 | 5/2013 | Kizilyalli et al. |
| 2014/0042447 A1* | 2/2014 | Nie ..................... H01L 21/6835 257/76 |
| 2014/0183442 A1 | 7/2014 | Odnoblyudov et al. |
| 2014/0183543 A1 | 7/2014 | Disney et al. |
| 2016/0181240 A1* | 6/2016 | Mauder ............... H01L 27/0629 257/77 |
| 2016/0254391 A1* | 9/2016 | Kinoshita ......... H01L 21/02389 257/76 |
| 2017/0222064 A1* | 8/2017 | Kinoshita ............... C30B 29/38 |

\* cited by examiner

VERTICAL GALLIUM NITRIDE SCHOTTKY DIODE

CROSS-REFERENCES TO RELATED APPLICATIONS

This application claims the benefit of U.S. Provisional Patent Application No. 62/478,483, filed on Mar. 29, 2017, the contents of which is incorporated by reference in its entirety.

BACKGROUND OF THE INVENTION

Gallium nitride based power devices may be epitaxially grown on silicon substrates. The growth of gallium nitride based power devices on a silicon substrate is a heteroepitaxial growth process since the substrate and the epitaxial layers are composed of different materials. Due to the heteroepitaxial growth process, the epitaxially grown material may exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

According to some embodiments of the present invention, a vertical Schottky diode includes an ohmic contact, a first epitaxial N-type gallium nitride layer physically contacting the ohmic contact and having a first doping concentration, and a second epitaxial N-type gallium nitride layer physically contacting the first epitaxial N-type gallium nitride layer and having a second doping concentration that is lower than the first doping concentration. The vertical Schottky diode further includes a first edge termination region and a second edge termination region coupled to the second epitaxial N-type gallium nitride layer and separated from each other by a portion of the second epitaxial N-type gallium nitride layer, and a Schottky contact coupled to the portion of the second epitaxial N-type gallium nitride layer, and to the first edge termination region and the second edge termination region.

According to some other embodiments of the present invention, a method of forming a vertical Schottky diode includes providing an engineered substrate. The engineered substrate may include a polycrystalline ceramic core, a barrier layer encapsulating the polycrystalline ceramic core, a bonding layer coupled to the barrier layer, and a substantially single crystalline silicon layer coupled to the bounding layer. The method may further include forming a first epitaxial N-type gallium nitride layer coupled to the substantially single crystalline silicon layer and having a first doping concentration, and forming a second epitaxial N-type gallium nitride layer coupled to the first epitaxial N-type gallium nitride layer and having a second doping concentration that is lower than the first doping concentration. The method may further include forming a first edge termination region and a second edge termination region coupled to the second epitaxial N-type gallium nitride layer and separated from each other by a portion of the second epitaxial N-type gallium nitride layer, and forming a Schottky contact coupled to the portion of the second epitaxial N-type gallium nitride layer and to the first edge termination region and the second edge termination region. The method may further include removing the engineered substrate to expose a back surface of the first epitaxial N-type gallium nitride layer, and forming an ohmic contact coupled to the back surface of the first epitaxial N-type gallium nitride layer.

According to some further embodiments of the present invention, a vertical Schottky diode includes a metal tab, an ohmic contact coupled to the metal tab, a first epitaxial N-type gallium nitride layer electrically contacting the ohmic contact and having a first doping concentration, and a second epitaxial N-type gallium nitride layer physically contacting the first epitaxial N-type gallium nitride layer and having a second doping concentration that is lower than the first doping concentration. The vertical Schottky diode further includes a Schottky contact coupled to a portion of the second epitaxial N-type gallium nitride layer. The Schottky contact has a step-wise structure such that a cross-section of the Schottky contact is narrower in a region proximal to the second epitaxial N-type gallium nitride layer and wider in a second region distal to the second epitaxial N-type gallium nitride layer.

DETAILED DESCRIPTION OF SPECIFIC EMBODIMENTS

The present invention relates generally to vertical Schottky diodes. More specifically, the present invention relates to methods and systems suitable for fabricating vertical Schottky diodes using epitaxial growth processes. Merely by way of example, the invention has been applied to a method and system for fabricating vertical Schottky diodes on a substrate by epitaxial growth, wherein the substrate is characterized by a coefficient of thermal expansion (CTE) that is substantially matched to epitaxial layers that form the vertical Schottky diodes. The methods and techniques may be applied to a variety of semiconductor processing operations.

Figure 1:
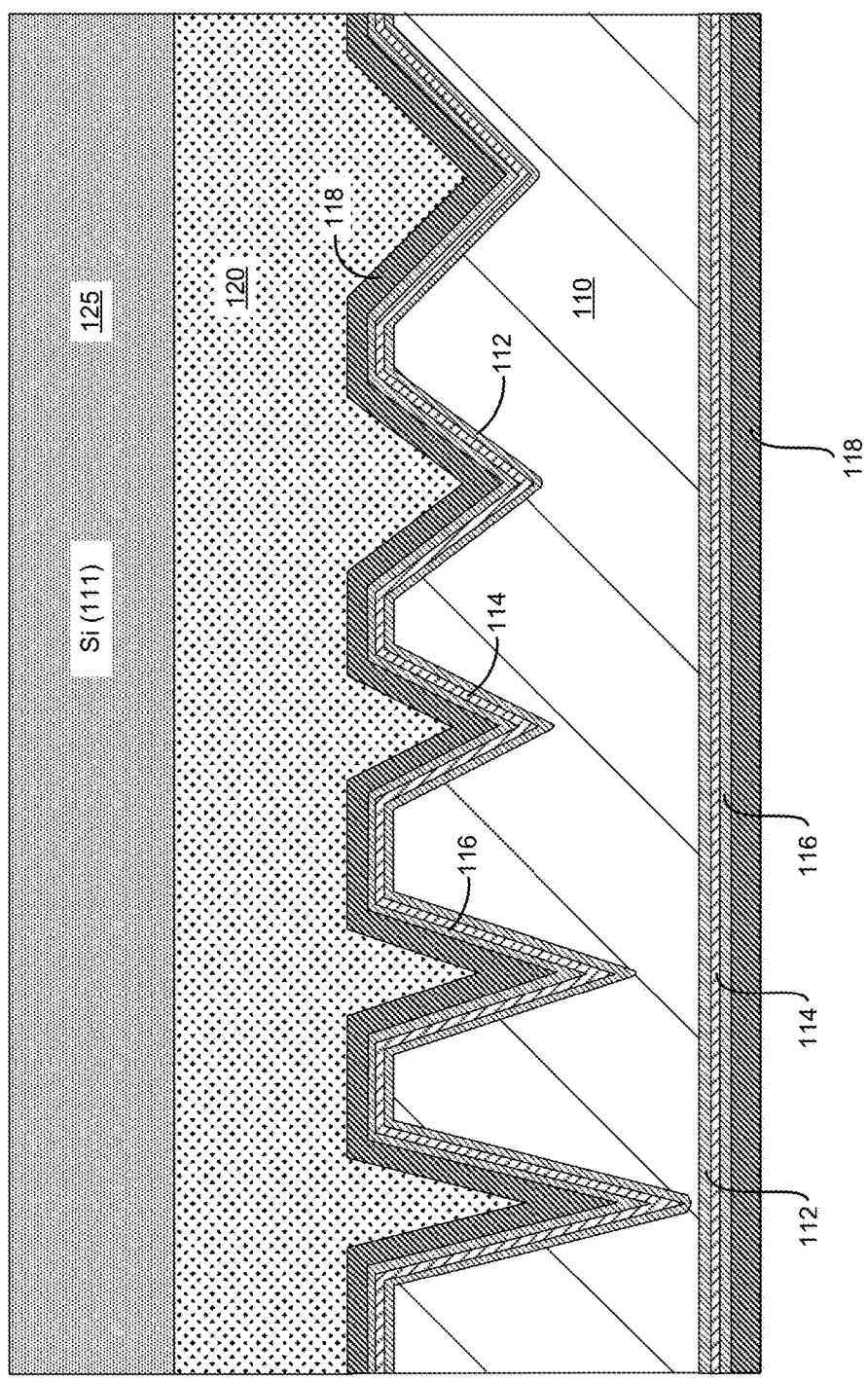
FIG. 1 is a simplified schematic cross-sectional diagram illustrating an engineered substrate structure according to some embodiments of the present invention.

FIG. 1 is a simplified schematic diagram illustrating an engineered substrate structure according to some embodiments of the present invention. As illustrated in FIG. 1, the engineered substrate structure may be suitable for a variety of electronic and optical applications. The engineered substrate structure includes a core 110 (e.g., AlN) that may have a coefficient of thermal expansion (CTE) that is substantially matched to the CTE of the epitaxial material that will be grown on the engineered substrate structure, for example, on the exfoliated silicon (111) layer 125.

For applications including the growth of gallium nitride (GaN)-based materials (epitaxial layers including GaN-based layers), the core 110 may be a polycrystalline ceramic material, for example, polycrystalline aluminum nitride (AlN), which may include a binding material such as yttrium oxide. Other materials may be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 110 may be on the order of 100 to 1,500 μm, for example, 750 μm. The core 110 is encapsulated in an adhesion layer 112 that may be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer 112 varies, for example, from 100 Å to 2,000 Å. Although TEOS oxides are utilized for adhesion layers 112 in some embodiments, other materials that provide for adhesion between later deposited layers and underlying layers or materials (e.g., ceramics, in particular, polycrystalline ceramics) may be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 112 completely surrounds the core 110 in some embodiments to form a fully encapsulated core 110 and may be formed using an LPCVD process or other suitable deposition processes, which may be compatible with semiconductor processing and in particular with polycrystalline or composite substrates and layers. The adhesion layer 112 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes may be utilized according to embodiments of the present invention, including CVD processes or similar deposition processes. As an example, a deposition process that coats a portion of the core 110 may be utilized, the core 110 may be flipped over, and the deposition process could be repeated to coat additional portions of the core 110. Thus, although LPCVD techniques are utilized in some embodiments to provide a fully encapsulated structure, other film formation techniques may be utilized depending on the particular application.

A conductive layer 114 is formed surrounding the adhesion layer 112. In an embodiment, the conductive layer 114 is a shell of polysilicon (i.e., polycrystalline silicon) that is formed surrounding the adhesion layer 112 since polysilicon may exhibit poor adhesion to ceramic materials. In embodiments in which the conductive layer 114 is polysilicon, the thickness of the polysilicon layer may be on the order of 500-5,000 Å, for example, 2,500 Å. In some embodiments, the polysilicon layer may be formed as a shell to completely surround the adhesion layer 112 (e.g., a TEOS oxide layer), thereby forming a fully encapsulated adhesion layer 112, and may be formed using an LPCVD process. In other embodiments, as discussed below, the conductive material may be formed on a portion of the adhesion layer 112, for example, a lower half of the substrate structure. In some embodiments, conductive material may be formed as a fully encapsulating layer and subsequently removed on one side of the substrate structure.

In an embodiment, the conductive layer 114 may be a polysilicon layer doped to provide a highly conductive material, for example, doped with boron to provide a p-type polysilicon layer. In some embodiments, the doping with boron is at a level of $1\times10^{19}$ $cm^{-3}$ to $1\times10^{20}$ $cm^{-3}$ to provide for high conductivity. Other dopants at different dopant concentrations (e.g., phosphorus, arsenic, bismuth, or the like at dopant concentrations ranging from $1\times10^{16}$ $cm^{-3}$ to $5\times10^{18}$ $cm^{-3}$) may be utilized to provide either n-type or p-type semiconductor materials suitable for use in the conductive layer 114. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 114 enables electrical contact with the chuck or capacitive coupling to the e-chuck during future processing including bonding. Thus, embodiments of the present invention provide substrate structures that may be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that may result in lower stress, more uniform deposition thicknesses, and better stoichiometry control through the subsequent layer formations.

A second adhesion layer 116 (e.g., a TEOS oxide layer on the order of 1,000 Å in thickness) is formed surrounding the conductive layer 114. The second adhesion layer 116 completely surrounds the conductive layer 114 in some embodiments to form a fully encapsulated structure and may be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 2,000 Å to 5,000 Å in thickness. The barrier layer 118 completely surrounds the second adhesion layer 116 in some embodiments to form a fully encapsulated structure and may be formed using an LPCVD process. In addition to silicon nitride layers, amorphous materials including SiCN, SiON, AlN, SiC, and the like may be utilized as barrier layers 118. In some implementations, the barrier layer 118 consists of a number of sub-layers that are built up to form the barrier layer 118. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, may be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities may include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate structure to prevent this undesirable diffusion.

A bonding layer 120 (e.g., a silicon oxide layer) is deposited on a portion of the barrier layer 118, for example, the top surface of the barrier layer 118, and subsequently used during the bonding of a substantially single crystal layer 125 (e.g., a single crystal silicon layer such as the exfoliated silicon (111) layer illustrated in FIG. 1). The bonding layer 120 may be approximately 1.5 μm in thickness in some embodiments. In some embodiments, the thickness of the bonding layer 120 is 20 nm or more for bond-induced void mitigation. In some embodiments, the thickness of the bonding layer 120 is in the range of 0.75-1.5 μm.

The substantially single crystal layer 125 (e.g., exfoliated Si (111)) is suitable for use as a growth layer during an epitaxial growth process for the formation of epitaxial materials. In some embodiments, the epitaxial material may include a GaN layer 2 μm to 10 μm in thickness, which may be utilized as one of a plurality of layers utilized in opto-electronic, RF, and power devices. In an embodiment, the substantially single crystal layer 125 includes a single crystal silicon layer that is attached to the bonding layer 120 using a layer transfer process.

Additional description related to the engineered substrate structure is provided in U.S. patent application Ser. No. 15/621,335, filed on Jun. 13, 2017, and U.S. patent application Ser. No. 15/621,235, filed on Jun. 13, 2017, the disclosures of which are hereby incorporated by reference in their entirety for all purposes.

Figure 2:
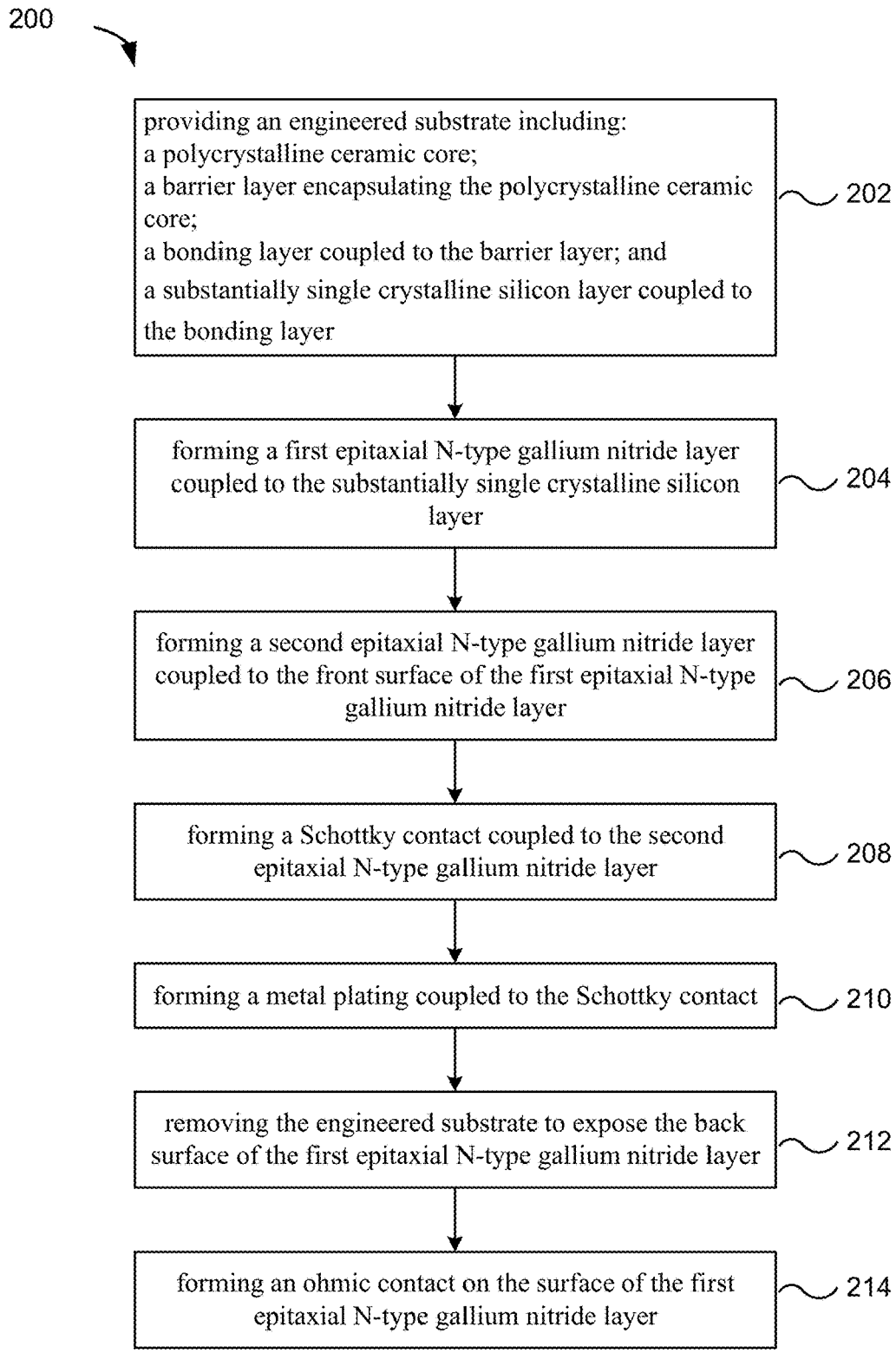
FIG. 2 shows a simplified flowchart illustrating a method of forming a Schottky barrier diode (SBD) according to some embodiments of the present invention.

FIG. 2 shows a simplified flowchart illustrating a method 200 of forming a Schottky barrier diode (SBD) according to some embodiments of the present invention. FIGS. 3A-3H show schematic cross-sectional diagrams illustrating the intermediate steps of the method 200 according to some embodiments of the present invention.

Figure 3:
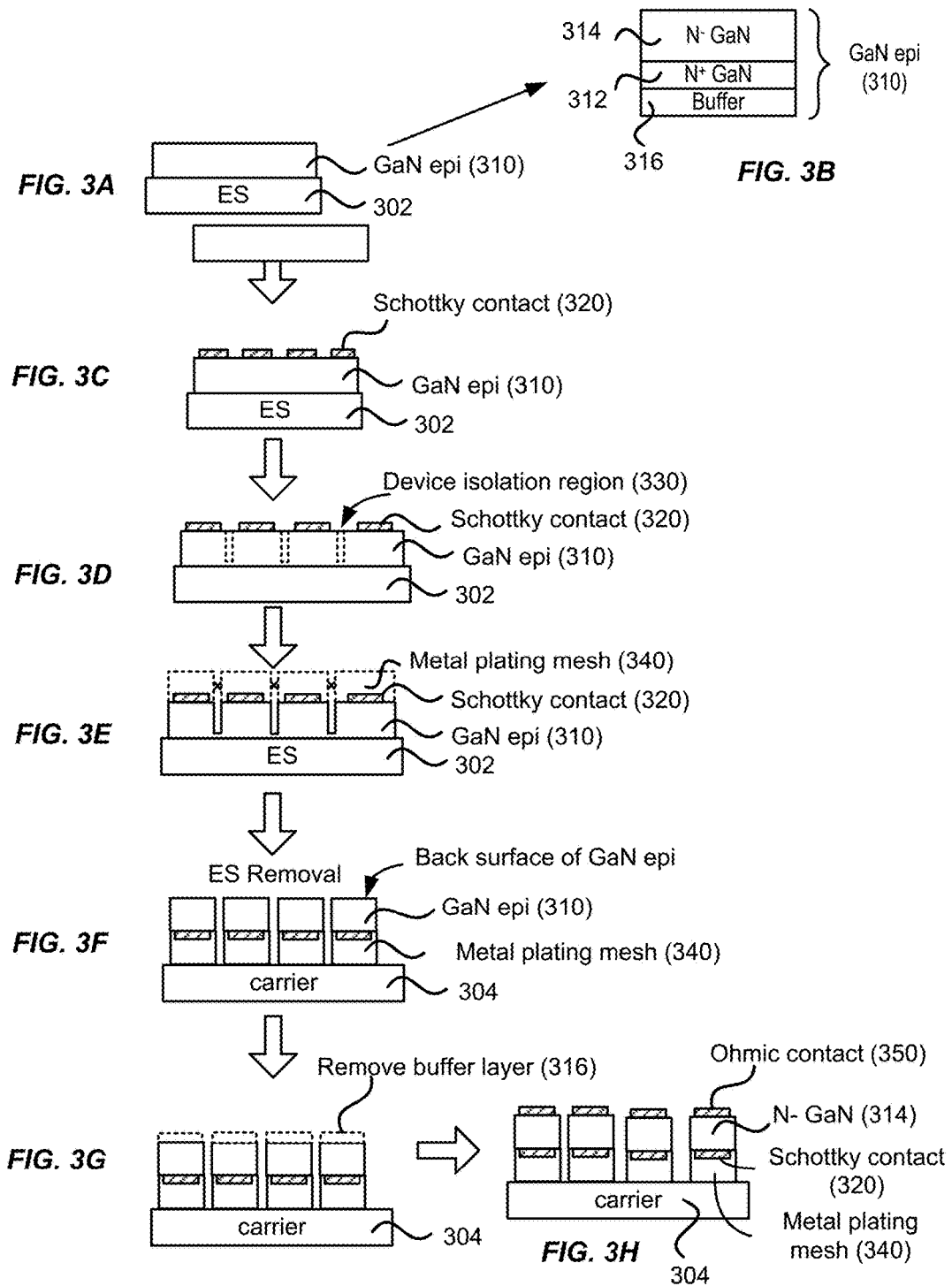
FIGS. 3A-3H show schematic cross-sectional diagrams illustrating the intermediate steps of the method shown in FIG. 2 according to some embodiments of the present invention.

Referring to FIGS. 2 and 3A, the method 200 includes, at 202, providing an engineered substrate (ES) 302. According to some embodiments, the engineered substrate 302 may include a polycrystalline ceramic core, a barrier layer encapsulating the polycrystalline ceramic core, a bonding layer coupled to the barrier layer, and a substantially single crystalline silicon layer coupled to the bonding layer.

In some embodiments, the polycrystalline ceramic core of the engineered substrate may include polycrystalline aluminum gallium nitride (AlGaN), polycrystalline gallium nitride (GaN), polycrystalline aluminum nitride (AlN), polycrystalline silicon carbide (SiC), or a combination thereof. In some embodiments, the barrier layer may include $Si_xO_y$, $Si_xN_y$, $Si_xO_yN_z$, SiCN, SiON, AlN, SiC, or a combination thereof. In some embodiments, the bonding layer may include an oxide layer, such as a silicon oxide layer. In one embodiment, the single crystal silicon layer includes a silicon (111) layer that may be suitable for use as a growth layer during epitaxial growth process for the formation of epitaxial materials as discussed below.

In some embodiments, as discussed above with reference to FIG. 1, the engineered substrate 302 may further include a first adhesion layer coupled to the polycrystalline ceramic core, a conductive layer coupled to the first adhesion layer, and a second adhesion layer coupled to the conductive layer, where the first adhesion layer, the conductive layer and the second adhesion layer are disposed between the polycrystalline ceramic core and the barrier layer. In some embodiments, the first adhesion layer may comprise a first tetraethyl orthosilicate (TEOS) oxide layer, and the second adhesion layer may comprise a second TEOS oxide layer. The conductive layer may comprise a polysilicon layer. In some embodiments, the engineered substrate 302 may further include a nucleation layer coupled to the substantially single crystalline silicon layer for facilitating the formation of the epitaxial device layers.

Referring to FIGS. 2, and 3A-3B, the method 200 further includes, at 204, forming a first epitaxial N-type gallium nitride (GaN) layer 312 (may be referred to as an "$N^+$ GaN" layer) coupled to the substantially single crystalline silicon layer. The first epitaxial N-type GaN layer 312 has a back surface and a front surface. The back surface is coupled to the engineered substrate 302. The method 200 further includes, at 206, forming a second epitaxial N-type GaN layer 314 (may be referred to as an "$N^-$ GaN" layer) coupled to the front surface of the first epitaxial N-type GaN layer 312.

The first N-type GaN layer 312 may facilitate the formation of an ohmic contact and may have a relatively high N-type doping concentration, for example in the order of about $1\times10^{18}$ cm$^{-3}$. The second N-type GaN layer 314 may serve as a drift region and may have a relatively low doping concentration, for example in the order of about $1 \times 10^{16}$ $cm^{-3}$. In some embodiments, the second N-type GaN layer 314 may have a thickness that is greater than about 20 µm. By using a CTE-matched engineered substrate 302, epitaxial growth of a relatively thick drift region with low dislocation density may be possible. A thicker drift region may afford the Schottky diode lower leakage current and a much higher breakdown voltage, as well as many other advantages.

According to some embodiments, the method 200 may further include, before forming the first epitaxial N-type GaN layer 312 and the second epitaxial N-type GaN layer 314, forming a buffer layer 316 coupled to the substantially single crystal layer. The first epitaxial N-type GaN layer 312 and the second epitaxial N-type GaN layer 314 are then subsequently formed on the buffer layer 316. In some embodiments, the buffer layer 316 may include a superlattice that includes a plurality of layers. For example, the buffer layer 316 may include an aluminum nitride layer coupled to the single crystal silicon layer, an aluminum gallium nitride layer coupled to the aluminum nitride layer, and a gallium nitride layer coupled to the aluminum gallium nitride layer. In another embodiment, the buffer layer 316 may include a single layer of aluminum gallium nitride. The entire epitaxial layer 310 including the buffer layer 316, the first epitaxial N-type GaN layer 312, and the second epitaxial N-type GaN layer 314 may be referred to as the GaN epitaxial layer 310, as illustrated in FIG. 3B.

According to some embodiments, the first epitaxial N-type GaN layer 312, the second epitaxial N-type GaN layer 314, and the buffer layer 316 may be formed by thin film deposition techniques such as chemical vapor deposition CVD (including metal-organic CVD (MOCVD), low-pressure CVD (LPCVD), plasma-enhanced CVD (PECVD), atomic-layer CVD (ALCVD)), hydride vapor phase epitaxy (HVPE), atomic layer deposition (ALD), molecular beam epitaxy (MBE), or a combination thereof.

Referring to FIGS. 2 and 3C, the method 200 further includes, at 208, forming one or more Schottky contacts 320 coupled to the second epitaxial N-type GaN layer 314. The Schottky contacts 320 may be formed by a suitable metallization process. In some embodiments, the Schottky contacts 320 may comprise a nickel-platinum (Ni/Pt) alloy, a nickel-gold (Ni/Au) alloy, or the like. Referring to FIG. 3D, after the Schottky contacts 320 are formed, the method 200 may further include forming a plurality of device isolation regions 330. The device isolation regions 330 may be formed by etching away portions of the GaN epitaxial layer 310 in the regions between adjacent devices.

Referring to FIGS. 2 and 3E, the method 200 further includes, at 210, forming a metal plating mesh 340 over the one or more Schottky contacts. In some embodiments, the metal plating mesh 340 may comprise copper (Cu) or other suitable metal. In some embodiments, the metal plating mesh 340 may have a thickness ranging from about 50 µm to about 100 µm.

Referring to FIGS. 2 and 3F, the method 200 further includes, at 212, removing the engineered substrate 302 to expose the back surface of the first epitaxial N-type GaN layer 312. The engineered substrate 302 may be removed, for example, by mechanical polishing, dry etch, wet etch, or a liftoff process using an etching chemical such as hydrofluoric acid (HF) or sulfuric acid ($H_2SO_4$). Because the epitaxial gallium nitride layer 310 is formed on substantially CTE-matched engineered substrate 302, the GaN epitaxial layer 310 may not curl under stress after the engineered substrate 302 is removed.

After the engineered substrate 302 is removed, the device structure may be flipped, and an optional carrier substrate 304 may be temporarily bonded to the metal plating mesh 340 using an epoxy, as illustrated in FIG. 3F. Referring to FIGS. 2 and 3G, the method 200 may include removing the buffer layer 316 to access the first epitaxial N-type GaN layer 312. Referring to FIGS. 2 and 3H, the method 200 further includes, at 214, forming one or more ohmic contacts 350 on the back surface of the first epitaxial N-type GaN layer 312.

Figure 4:
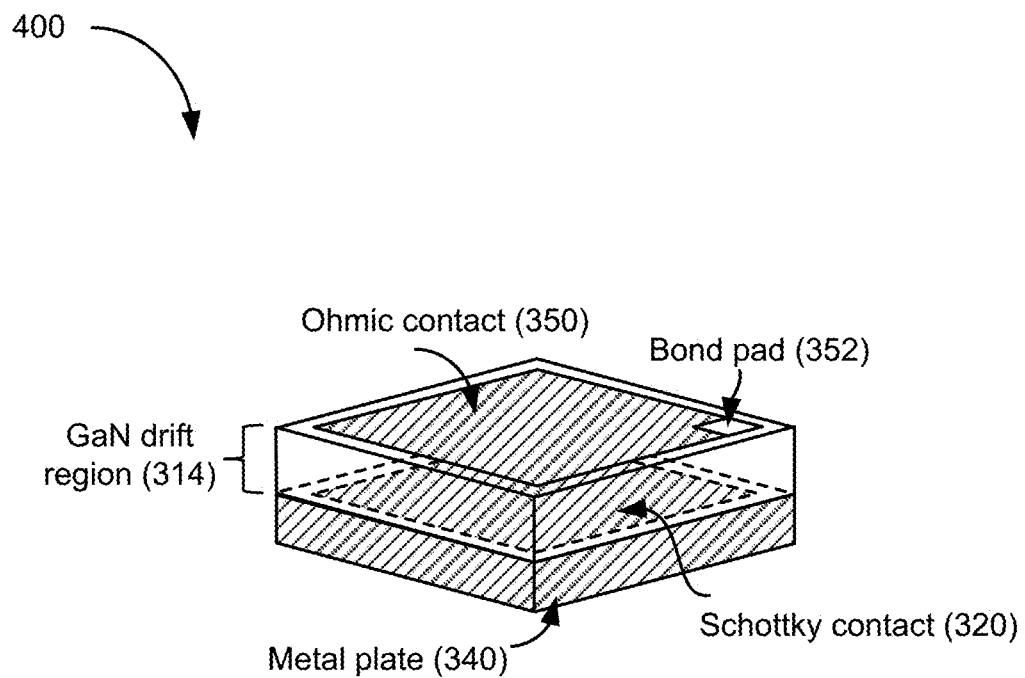
FIG. 4 illustrates schematically a perspective view of a Schottky diode according to some embodiments of the present invention.

According to an embodiment, the carrier substrate 304 may be removed and the device structure may be diced to produce one or more chip-scale package (CSP) Schottky diodes. FIG. 4 illustrates schematically a perspective view of a Schottky diode 400 that may be made using the method 200 described above, according to an embodiment of the present invention. The Schottky diode 400 may include a bond pad 352 electrically coupled to the ohmic contact 350 as a cathode electrode. In some embodiments, the Schottky diode 400 may have a GaN drift region 314 (i.e., the second N-type GaN layer) with a thickness that is greater than about 20 µm. The ability to deposit a relatively thick drift region 314 with low dislocation density may afford the Schottky diode 400 low leakage current and a much higher breakdown voltage, as well as many other advantages.

In some other embodiments, the step of forming the plurality of device isolation regions 330 may be omitted. After removing the engineered substrate 302, ohmic contacts 350 are formed on the back surface of the first epitaxial N-type GaN layer 312. Then the device structure may be diced from the back side to produce one or more Schottky diodes.

It should be appreciated that the specific steps illustrated in FIG. 2 provide a particular method of 200 according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

According to some embodiments of the present invention, a vertical Schottky diode may incorporate field control structures at the periphery regions to reduce the magnitude of electric field concentration. Junction termination extensions (JTEs) may extend laterally from a junction to spread a field over a larger area, and thus may increase breakdown voltages and decrease current leakage.

Figure 5:
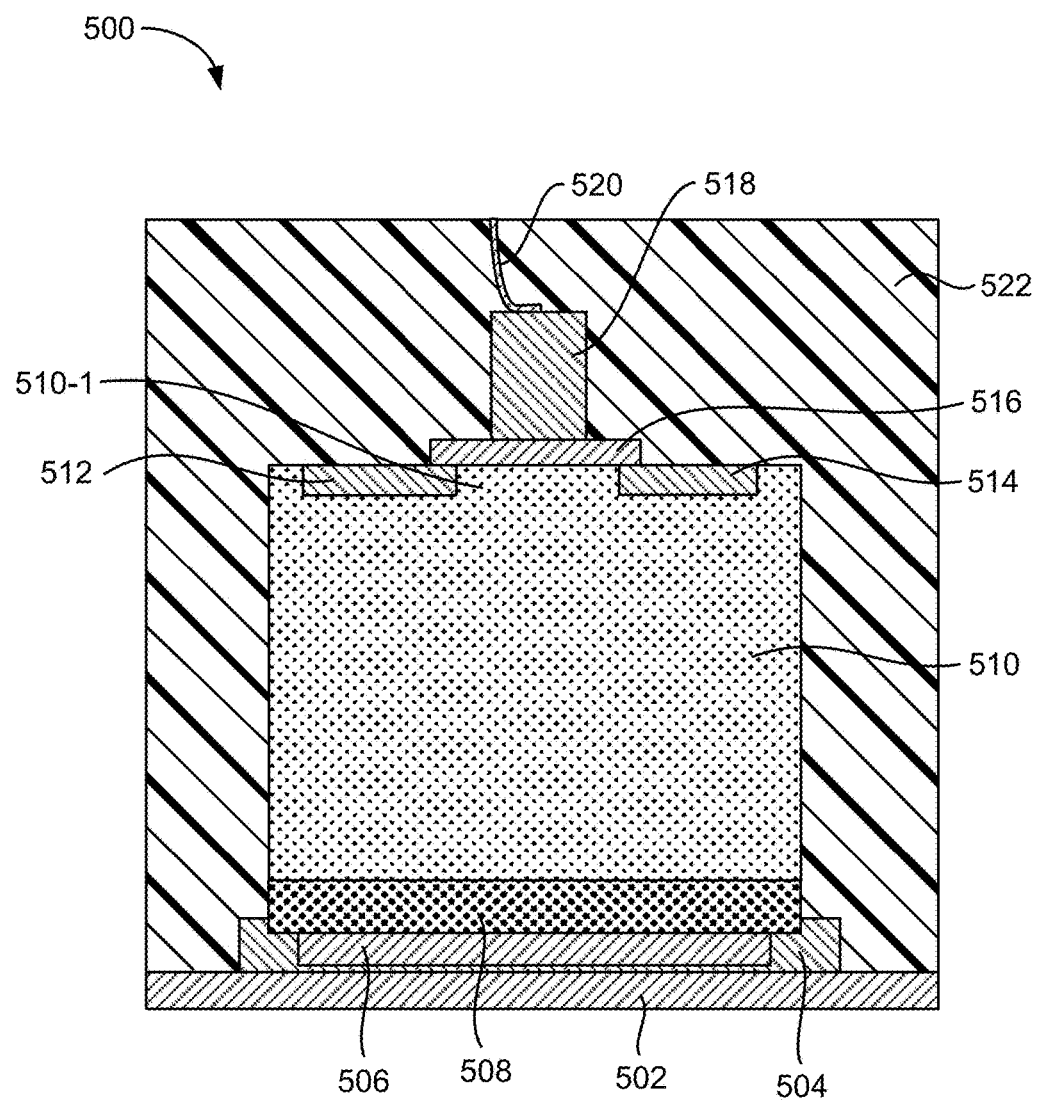
FIG. 5 illustrates schematically a cross-sectional view of a vertical Schottky diode according to some embodiments of the present invention.

FIG. 5 illustrates schematically a cross-sectional view of a vertical Schottky diode 500 according to some embodiments of the present invention. The vertical Schottky diode 500 may include an ohmic contact 506. For example, the ohmic contact 506 may comprise titanium (Ti), aluminum (Al), nickel (Ni), gold (Au), silver (Ag), or a combination thereof. The vertical Schottky diode 500 may further include a first epitaxial N-type gallium nitride layer 508 ($n^+$ GaN layer) that physically contacts the ohmic contact 506. The first epitaxial N-type gallium nitride layer 508 may be heavily doped to facilitate the formation of the ohmic contact 506. For example, the first epitaxial N-type gallium nitride layer 508 may have a first doping concentration on the order of $1 \times 10^{18}$ $cm^{-3}$. The vertical Schottky diode 500 may further include a second epitaxial N-type gallium nitride layer (n⁻ GaN layer) 510 coupled to the first epitaxial N-type gallium nitride layer 508. The second epitaxial N-type gallium nitride layer 510 may be an unintentionally doped GaN layer and may serve as a drift region. The second epitaxial N-type gallium nitride layer 510 may have a second doping concentration ranging from about $2\times10^{15}$ cm$^{-3}$ to about $1\times10^{16}$ cm$^{-3}$. In some embodiments, the second epitaxial N-type gallium nitride layer 510 may include an interfacial layer at the interface to the first epitaxial N-type gallium nitride layer 508. The interfacial layer may include aluminum gallium nitride, indium gallium nitride, and the like.

Although some embodiments have been discussed in terms of a layer, the term layer should be understood such that a layer may include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

In some embodiments, the first epitaxial N-type gallium nitride layer 508 and the second epitaxial N-type gallium nitride layer 510 may be formed on an engineered substrate as described above and shown in FIG. 1. Because the engineered substrate includes a core 110 (e.g., AlN) that may have a coefficient of thermal expansion (CTE) that is substantially matched to the CTE of the first epitaxial N-type gallium nitride layer 508 and the second epitaxial N-type gallium nitride layer 510, it may be possible to grow a relatively thick second epitaxial N-type gallium nitride layer and still maintain good crystalline quality. In some embodiments, the second epitaxial N-type gallium nitride layer 510 may have a thickness ranging from about 10 µm to about 25 µm. The ability to deposit a relatively thick drift region by epitaxial growth on an engineered substrate may afford the Schottky diode 500 low leakage current and a higher breakdown voltage, as well as many other advantages. The engineered substrate may be subsequently removed to expose a back surface of the first epitaxial N-type gallium nitride layer 508 and facilitate the formation of the ohmic contact 506.

On the other hand, the second epitaxial N-type gallium nitride layer 510 may still be relatively thin to have a lower thermal resistance than those in GaN-based devices formed on a bulk single-crystalline GaN substrate, since bulk single-crystalline GaN substrates are usually relatively thick and cannot be removed. A lower thermal resistance may be advantageous for thermal management as heat is generated when current flows vertically through the vertical Schottky diode 500.

In some embodiments, the vertical Schottky diode 500 may further include a first edge termination region 512 and a second edge termination region 514 coupled to the second epitaxial N-type gallium nitride layer 510. The first edge termination region 512 and the second edge termination region 514 may be separated from each other by a portion 510-1 of the second epitaxial N-type gallium nitride layer 510. The vertical Schottky diode 500 may further include a Schottky contact 516 coupled to the portion 510-1 of the second epitaxial N-type gallium nitride layer 510. The Schottky contact 516 may comprise, for example, TaN, WN, or other metals and metal alloys. The Schottky contact 516 may overlap with the first edge termination region 512 and the second edge termination region 514.

According to some embodiments, the first edge termination region 512 and the second edge termination region 514 may be formed by doping a first portion and a second portion of the second epitaxial N-type gallium nitride layer 510 by magnesium (Mg) ion implantation. Thus, the first edge termination region 512 and the second edge termination region 514 may be P-type doped regions. The first edge termination region 512 and the second edge termination region 514 may extend laterally from the Schottky junction to the edge of the die, so that they may spread a field over a larger area. As such, the breakdown voltage of the vertical Schottky diode 500 may be increased.

The vertical Schottky diode 500 may further include a pad metal 518 coupled to the Schottky contact 516, and a bond wire 520 electrically connected to the pad metal 518. The pad metal 518 may comprise, for example, palladium (Pd), gold (Au), silver (Ag), or other metals, or a combination thereof, or metal alloys. The vertical Schottky diode 500 may further include a metal tab 502 for supporting the die via a die attach solder 504. The metal tab 502 may comprise, for example, copper (Cu), aluminum (Al), gold (Au), platinum (Pt), or other metals and metal alloys. The vertical Schottky diode 500 may also be encapsulated by a molding compound 522.

Figure 6:
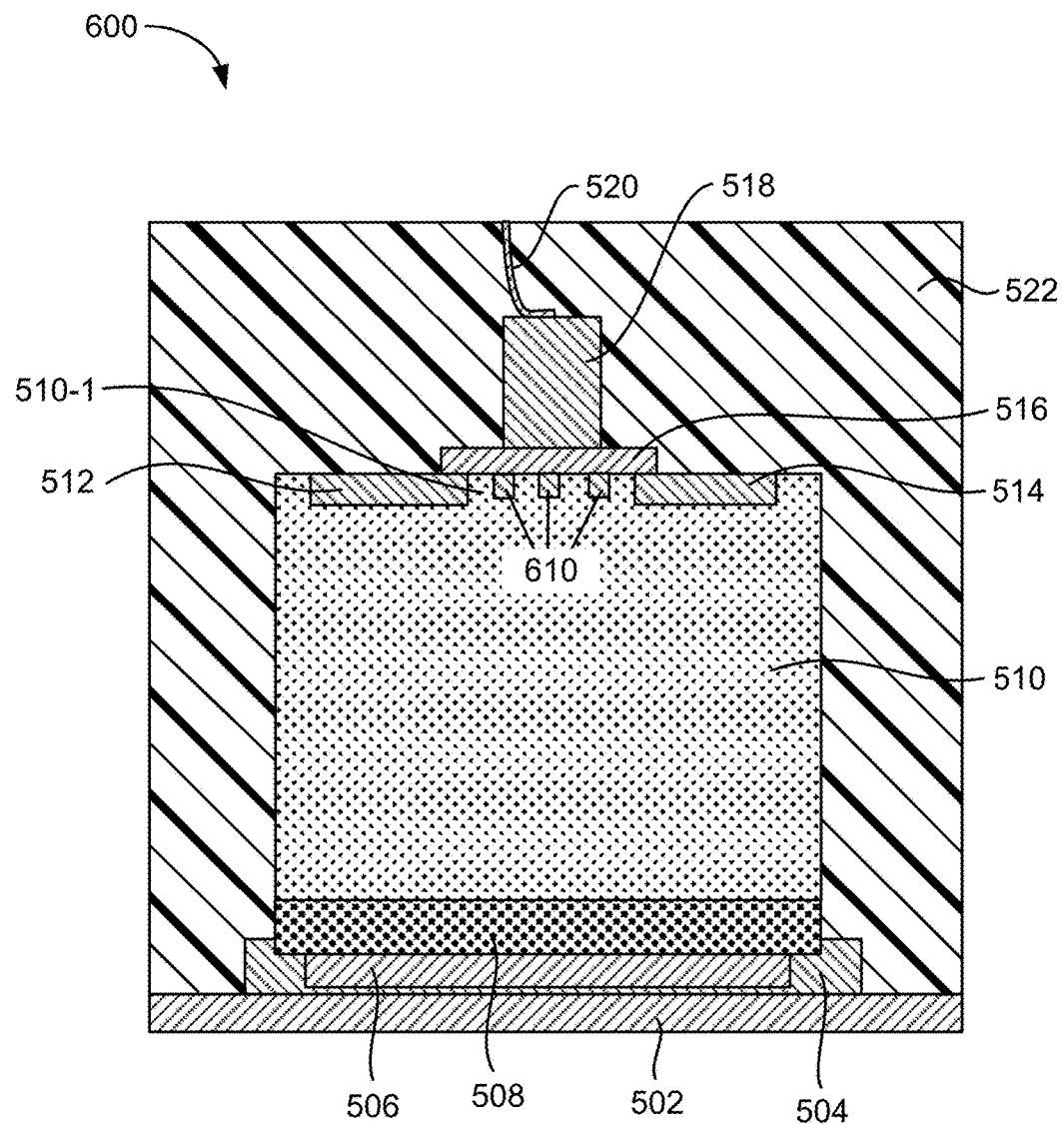
FIG. 6 illustrates schematically a cross-sectional view of a vertical junction barrier Schottky (JBS) diode according to some embodiments of the present invention.

FIG. 6 illustrates schematically a cross-sectional view of a vertical junction barrier Schottky (JBS) diode 600 according to some embodiments of the present invention. The vertical JBS diode 600 may be similar to the vertical Schottky diode 500 illustrated in FIG. 5, except that it may also include a plurality of grid regions 610 in the portion 510-1 of the second epitaxial N-type gallium nitride layer 510. The plurality of grid regions 610 are coupled to the Schottky contact 516. In some embodiments, the plurality of grid regions 610 may be formed by selective-area doping the portion 510-1 of the second epitaxial N-type gallium nitride layer 510 by magnesium (Mg) ion implantation.

Figure 7:
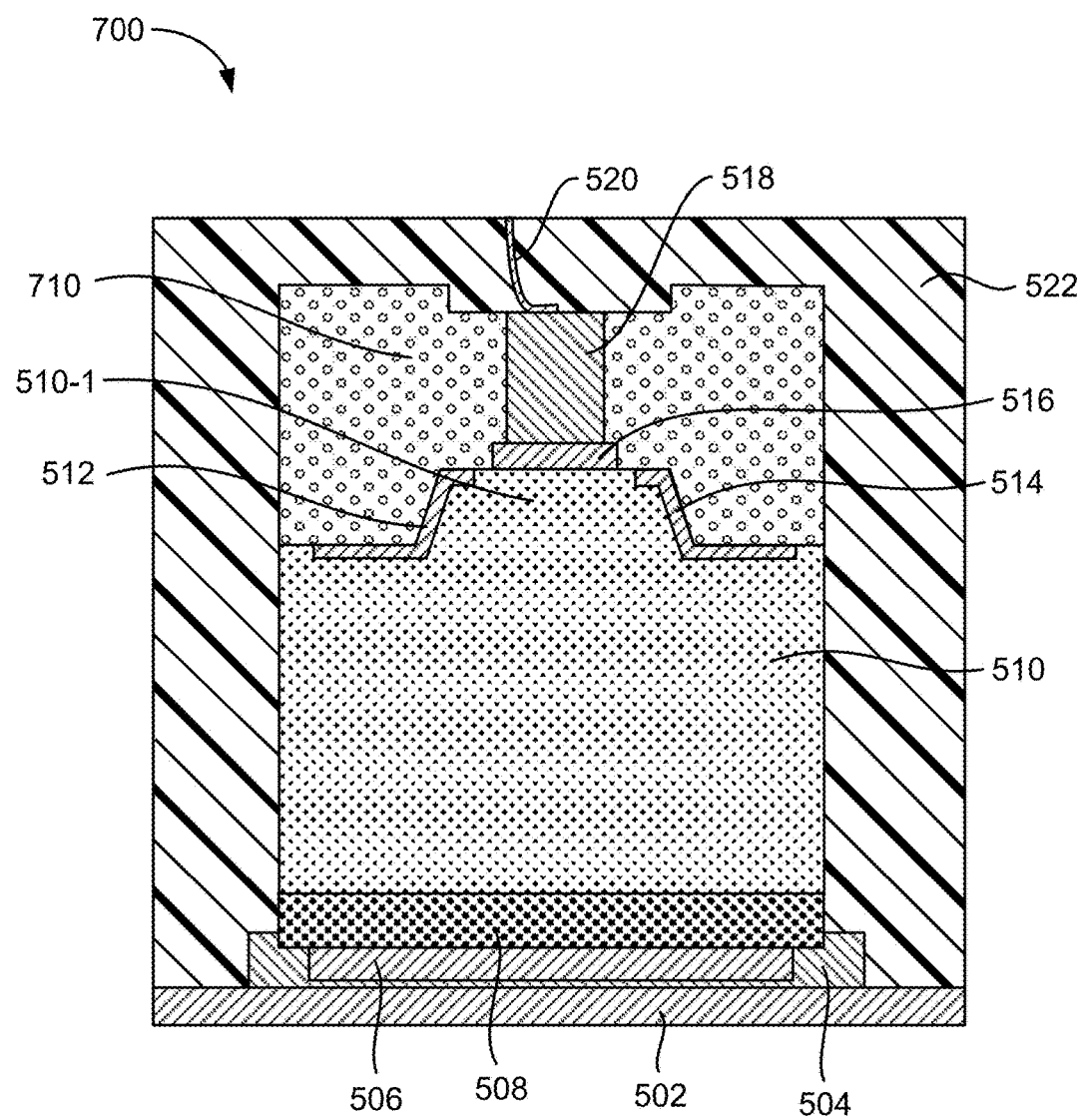
FIG. 7 illustrates schematically a cross-sectional view of a vertical Schottky diode according to some other embodiments of the present invention.

FIG. 7 illustrates schematically a cross-sectional view of a vertical Schottky diode 700 according to some other embodiments of the present invention. The vertical Schottky diode 700 may be similar to the vertical Schottky diode 500 illustrated in FIG. 5, except that the portion 510-1 of the second epitaxial N-type gallium nitride layer 510 between the first edge termination region 512 and the second edge termination region 514 forms a mesa that protrudes from the rest of the second epitaxial N-type gallium nitride layer 510. The first edge termination region 512 and the second edge termination region 514 may conform to a side wall of the mesa. The vertical Schottky diode 700 may further include a fill material 710 for packaging the device. The fill material 710 may cover the first edge termination region 512, the second edge termination region 514, the Schottky contact 516, and the pad metal 518.

Figure 8:
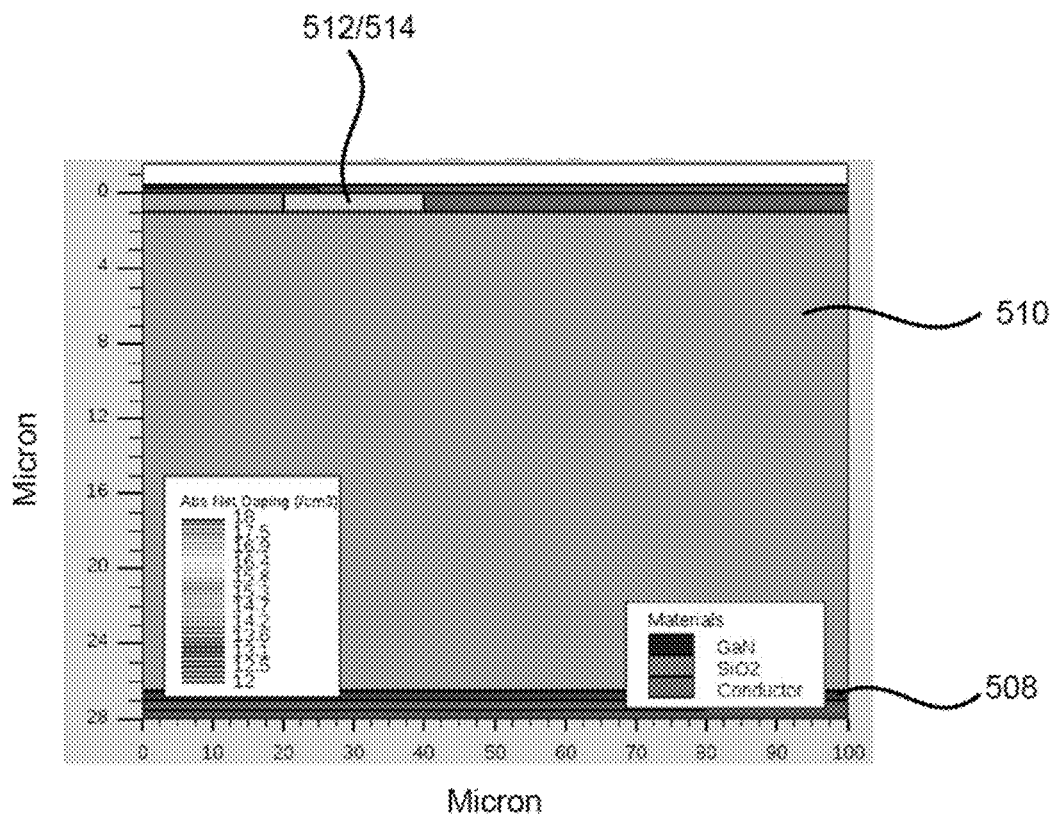
FIG. 8 shows a plot of the doping concentrations of a Schottky diode according to some embodiments of the present invention.

According to some embodiments, each of the first edge termination region 512 and the second edge termination region 514 of the vertical Schottky diodes, as illustrated in FIGS. 5-7, may comprise a single zone having a uniform doping concentration. FIG. 8 shows a gray-scale plot of the doping concentrations of a Schottky diode according to some embodiments of the present invention. For example, the doping concentration of the first edge termination region 512 and the second edge termination region 514 may be in a range between about $2\times10^{15}$ cm$^{-3}$ and about $5\times10^{16}$ cm$^{-3}$.

Figure 9:
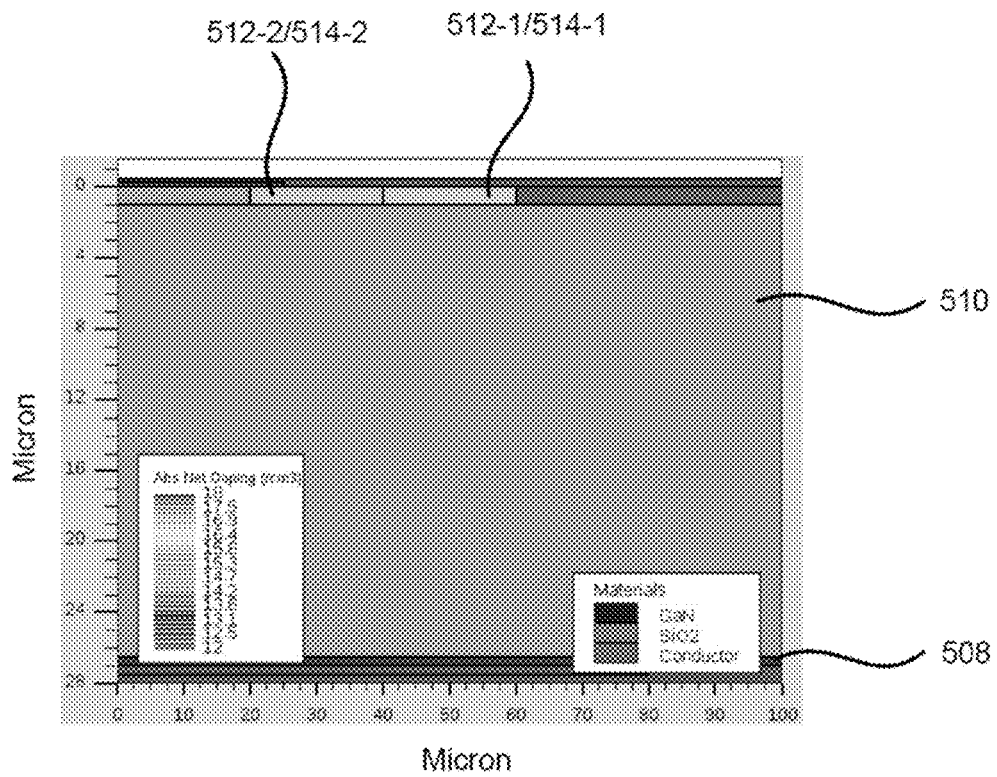
FIG. 9 shows a plot of the doping concentrations of a Schottky diode according to some other embodiments of the present invention.

According to some other embodiments, each of the first edge termination region 512 and the second edge termination region 514 of the vertical Schottky diodes, as illustrated in FIGS. 5-7, may comprise two lateral zones with different doping concentrations. FIG. 9 shows a gray-scale plot of the doping concentrations of a Schottky diode according to some other embodiments of the present invention. Each of the first edge termination region 512 and the second edge termination region 514 may include a first lateral zone 512-1/514-1, and a second lateral zone 512-2/514-2. The second lateral zone 512-2/514-2 may have a doping concentration that is higher than that of the first lateral zone 512-1/514-1, thus providing a graded JTE. For example, the first lateral zone 512-1/514-1 may have a doping concentration ranging from about $2\times10^{15}$ cm$^{-3}$ to about $5\times10^{16}$ cm$^{-3}$. The second lateral zone 512-2/514-2 may have a doping concentration ranging from about $5\times10^{16}$ cm$^{-3}$ to about $5\times10^{17}$ cm$^{-3}$.

Figure 10:
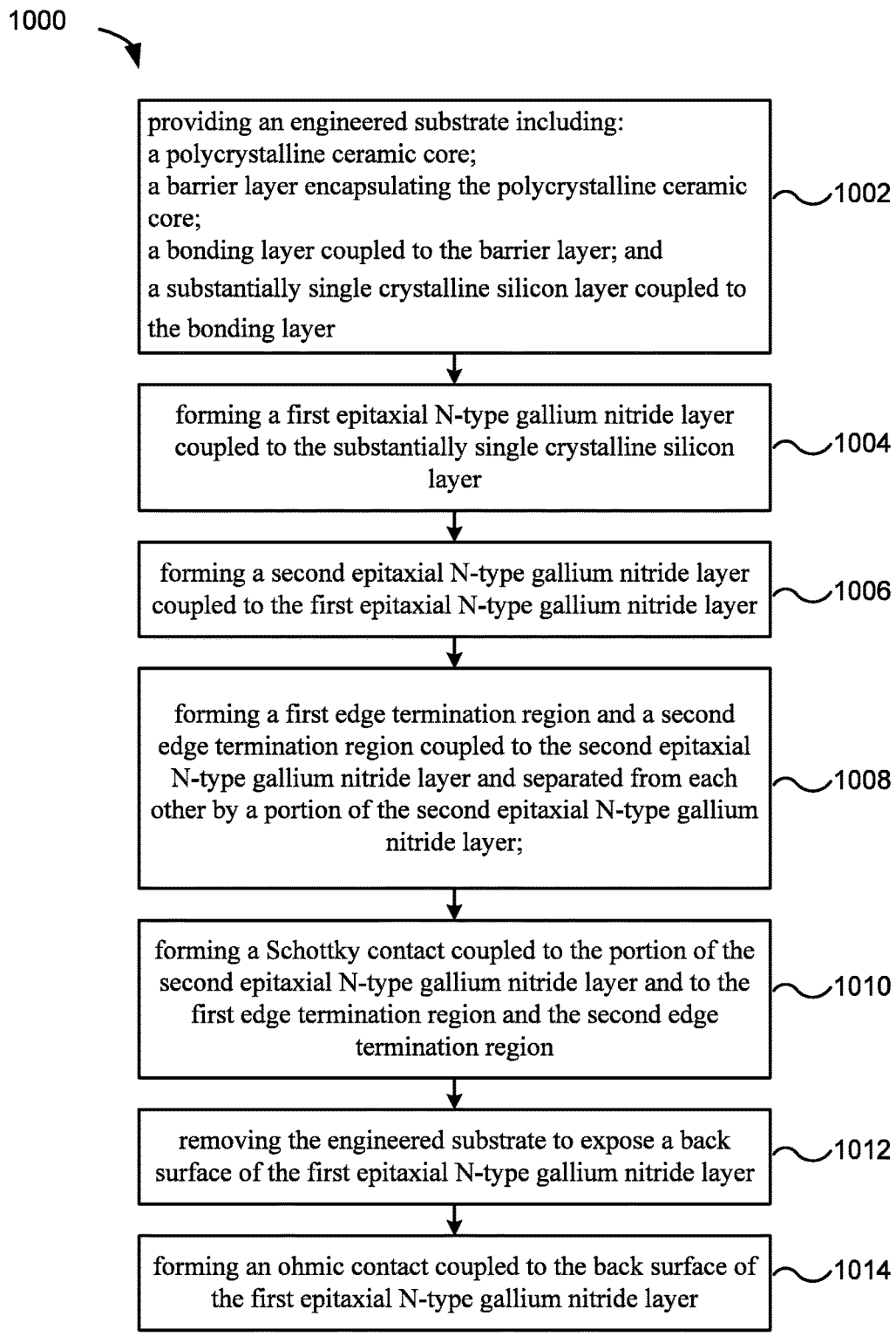
FIG. 10 shows a simplified flowchart illustrating a method of forming a vertical Schottky diode according to some embodiments of the present invention.

The FIG. 10 shows a simplified flowchart illustrating a method 1000 of forming a vertical Schottky diode according to some embodiments of the present invention. The method 1000 may include providing an engineered substrate (1002). The engineered substrate may include a polycrystalline ceramic core, a barrier layer encapsulating the polycrystalline ceramic core, a bonding layer coupled to the barrier layer, and a substantially single crystalline silicon layer coupled to the bounding layer. The method 1000 may further include forming a first epitaxial N-type gallium nitride layer coupled to the substantially single crystalline silicon layer (1004). The first epitaxial N-type gallium nitride layer may have a first doping concentration. The method 1000 may further include forming a second epitaxial N-type gallium nitride layer coupled to the first epitaxial N-type gallium nitride layer (1006). The second epitaxial N-type gallium nitride layer may have a second doping concentration that is lower than the first doping concentration.

The method 1000 may further include forming a first edge termination region and a second edge termination region (1008). The first edge termination region and the second edge termination region are coupled to the second epitaxial N-type gallium nitride layer and separated from each other by a portion of the second epitaxial N-type gallium nitride layer. The method 1000 may further include forming a Schottky contact coupled to the portion of the second epitaxial N-type gallium nitride layer and to the first edge termination region and the second edge termination region (1010). The method 1000 may further include removing the engineered substrate to expose a back surface of the first epitaxial N-type gallium nitride layer (1012), and forming an ohmic contact coupled to the back surface of the first epitaxial N-type gallium nitride layer (1014).

It should be appreciated that the specific steps illustrated in FIG. 10 provide a particular method of forming a vertical Schottky diode according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11:
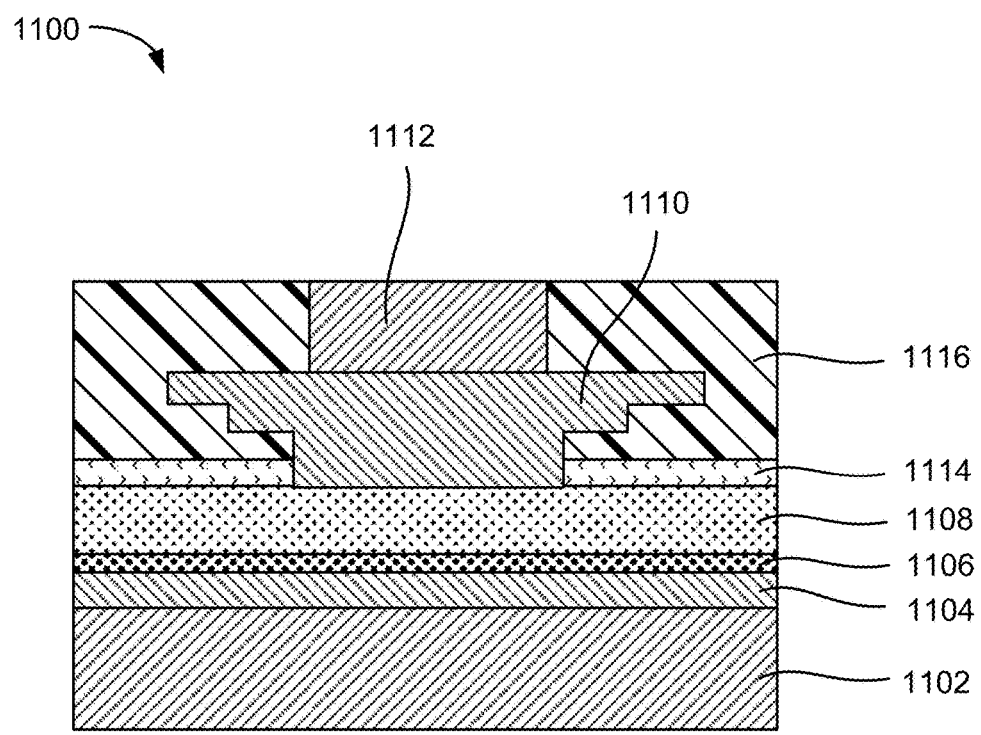
FIG. 11 illustrates schematically a cross-sectional view of a vertical Schottky diode according to some embodiments of the present invention.

In some other embodiments, field plates may be used for controlling the electric field at the periphery regions of a vertical Schottky diode. FIG. 11 illustrates schematically a cross-sectional view of a vertical Schottky diode 1100 according to some embodiments of the present invention. The vertical Schottky diode 1100 may include a metal tab 1102, an ohmic contact 1104 coupled to the metal tab 1102, and a first epitaxial N-type gallium nitride layer 1106 coupled to the ohmic contact 1104. The first epitaxial N-type gallium nitride layer 1106 may be heavy doped for facilitating the formation of the ohmic contact 1104. For example, the first epitaxial N-type gallium nitride layer 1106 may have a first doping concentration on the order of $1\times10^{18}$ cm$^{-3}$. The vertical Schottky diode 1100 may further include a second epitaxial N-type gallium nitride layer 1108 coupled to the first epitaxial N-type gallium nitride layer 1106. The second epitaxial N-type gallium nitride layer 1108 may be an unintentionally doped GaN layer and may serve as drift region. In some embodiments, the second epitaxial N-type gallium nitride layer 1108 may have a thickness ranging from about 10 μm to about 25 μm. The second epitaxial N-type gallium nitride layer 1108 may have a second doping concentration ranging from about $2\times10^{15}$ cm$^{-3}$ to about $1\times10^{16}$ cm$^{-3}$. In some embodiments, the second epitaxial N-type gallium nitride layer 1108 may include an interfacial layer at the interface to the first epitaxial N-type gallium nitride layer 1106. The interfacial layer may include aluminum gallium nitride, indium gallium nitride, and the like.

The vertical Schottky diode 1100 may further include a Schottky contact 1110 coupled to a portion of the second epitaxial N-type gallium nitride layer 1108. In some embodiments, the Schottky contact 1110 may have a step-wise structure such that the Schottky contact 1110 has a narrower cross section proximal to the second epitaxial N-type gallium nitride layer 1108 and a wider cross section distal to the second epitaxial N-type gallium nitride layer 1108. The vertical Schottky diode 1100 may further include a passivation layer 1114 covering the remaining portion of the second epitaxial N-type gallium nitride layer 1108, a pad metal 1112 coupled to the Schottky contact 1110, and an encapsulation layer 1116.

Figure 12:
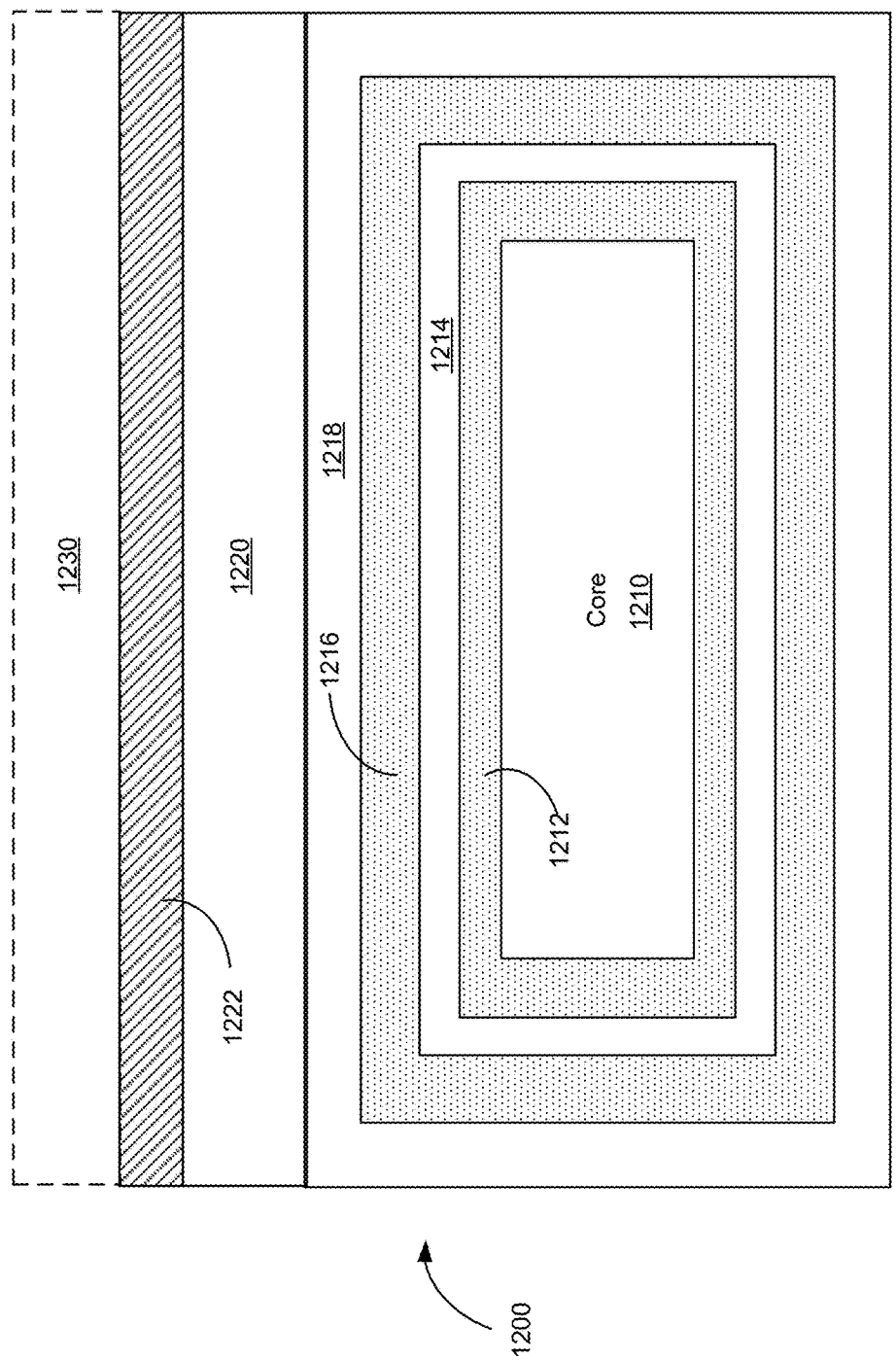
FIG. 12 is a simplified schematic diagram illustrating an engineered substrate structure according to some embodiments of the present invention.

According to some embodiments of the present invention, the vertical Schottky diodes illustrated in FIGS. 5-7 and 11 may be fabricated by epitaxial growth on an engineered substrate, which is subsequently removed. FIG. 12 is a simplified schematic cross-sectional diagram illustrating an engineered substrate 1200 according to some embodiments of the present invention. The engineered substrate 1200 illustrated in FIG. 12 is suitable for a variety of electronic and optical applications. The engineered substrate 1200 includes a core 1210 that may have a coefficient of thermal expansion (CTE) that is substantially matched to the CTE of the epitaxial material that will be grown on the engineered substrate 1200. Epitaxial material 1230 is illustrated as optional because it is not required as an element of the engineered substrate 1200, but will typically be grown on the engineered substrate 1200.

For applications including the growth of gallium nitride (GaN)-based materials (epitaxial layers including GaN-based layers), the core 1210 may be a polycrystalline ceramic material such as polycrystalline aluminum nitride (AlN), which may include a binding material such as yttrium oxide. Other materials may be utilized in the core 1210, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 1210 may be on the order of 100 μm to 1,500 μm, for example, 725 μm. The core 1210 is encapsulated in an adhesion layer 1212 that may be referred to as a shell or an encapsulating shell. In an embodiment, the adhesion layer 1212 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) may be utilized according to an embodiment of the present invention. For example, SiO$_2$ or other silicon oxides (Si$_x$O$_y$) adhere well to ceramic materials and provide a suitable surface for subsequent deposition, for example, of conductive materials. In some embodiments, the adhesion layer 1212 completely surrounds the core 1210 to form a fully encapsulated core. The adhesion layer 1212 may be formed using a low pressure chemical-vapor deposition (LPCVD) process. The adhesion layer 1212 provides a surface on which subsequent layers adhere to form elements of the engineered substrate 1200 structure.

In addition to the use of LPCVD processes, furnace-based processes, and the like to form the encapsulating first adhesion layer 1212, other semiconductor processes may be utilized according to embodiments of the present invention, including CVD processes or similar deposition processes. As an example, a deposition process that coats a portion of the core may be utilized, the core 1210 may be flipped over, and the deposition process could be repeated to coat additional portions of the core. Thus, although LPCVD techniques are utilized in some embodiments to provide a fully encapsulated structure, other film formation techniques may be utilized depending on the particular application.

A conductive layer 1214 is formed surrounding the adhesion layer 1212. In an embodiment, the conductive layer 1214 is a shell of polysilicon (i.e., polycrystalline silicon) that is formed surrounding the first adhesion layer 1212 since polysilicon may exhibit poor adhesion to ceramic materials. In embodiments in which the conductive layer 1214 is polysilicon, the thickness of the polysilicon layer may be on the order of 500-5,000 Å, for example, 2,500 Å. In some embodiments, the polysilicon layer may be formed as a shell to completely surround the first adhesion layer 1212 (e.g., a TEOS oxide layer), thereby forming a fully encapsulated first adhesion layer 1212, and may be formed using an LPCVD process. In other embodiments, as discussed below, the conductive material may be formed on a portion of the adhesion layer, for example, a lower half of the substrate structure. In some embodiments, conductive material may be formed as a fully encapsulating layer and subsequently removed on one side of the substrate structure.

In an embodiment, the conductive layer 1214 may be a polysilicon layer doped to provide a highly conductive material, for example, doped with boron to provide a P-type polysilicon layer. In some embodiments, the doping with boron is at a level of $1\times10^{19}$ cm$^{-3}$ to $1\times10^{20}$ cm$^{-3}$ to provide for high conductivity. Other dopants at different dopant concentrations (e.g., phosphorus, arsenic, bismuth, or the like at dopant concentrations ranging from $1\times10^{16}$ cm$^{-3}$ to $5\times10^{18}$ cm$^{-3}$) may be utilized to provide either N-type or P-type semiconductor materials suitable for use in the conductive layer 1214. One of ordinary skill in the art would recognize many variations, modifications, and alternatives.

The presence of the conductive layer 1214 is useful during electrostatic chucking of the engineered substrate 1200 to semiconductor processing tools, for example tools with electrostatic discharge chucks (ESC). The conductive layer 1214 enables rapid dechucking after processing in the semiconductor processing tools. Thus, embodiments of the present invention provide substrate structures that may be processed in manners utilized with conventional silicon wafers. One of ordinary skill in the art would recognize many variations, modifications, and alternatives.

A second adhesion layer 1216 (e.g., a TEOS oxide layer on the order of 1,000 Å in thickness) is formed surrounding the conductive layer 1214. In some embodiments, the second adhesion layer 1216 completely surrounds the conductive layer 1214 to form a fully encapsulated structure. The second adhesion layer 1216 may be formed using an LPCVD process, a CVD process, or any other suitable deposition process, including the deposition of a spin-on dielectric.

A barrier layer 1218, for example, a silicon nitride layer, is formed surrounding the second adhesion layer 1216. In an embodiment, the barrier layer 1218 is a silicon nitride layer that is on the order of 4,000 Å to 5,000 Å in thickness. The barrier layer 1218 completely surrounds the second adhesion layer 1216 in some embodiments to form a fully encapsulated structure and may be formed using an LPCVD process. In addition to silicon nitride layers, amorphous materials including SiCN, SiON, AlN, SiC, and the like may be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 1218, e.g., a silicon nitride layer, prevents diffusion and/or outgassing of elements present in the core 1210 into the environment of the semiconductor processing chambers in which the engineered substrate 1200 could be present, for example, during a high temperature (e.g., 1,000° C.) epitaxial growth process. Elements present in the core 1210 may include, for example, yttrium oxide (i.e., yttria), oxygen, metallic impurities, other trace elements, and the like. The elements diffused from the core 1210 may cause unintentional doping in engineered layers 1220/1222. The elements outgassed from the core 1210 may travel through the chamber and adsorb elsewhere on the wafer causing impurities in engineered layers 1220/1222 and epitaxial material 1230. Utilizing the encapsulating layers described herein, ceramic materials, including polycrystalline AlN that are designed for non-clean room environments, may be utilized in semiconductor process flows and clean room environments.

A bonding layer 1220 (e.g., a silicon oxide layer) is deposited on a portion of the barrier layer 1218, for example, the top surface of the barrier layer, and subsequently used during the bonding of a single crystal layer 1222. The bonding layer 1220 may be approximately 1.5 μm in thickness in some embodiments. The single crystal layer 1222 may include, for example, Si, SiC, sapphire, GaN, AlN, SiGe, Ge, Diamond, Ga$_2$O$_3$, AlGaN, InGaN, InN, and/or ZnO. In some embodiments, the single crystal layer 1222 may have a thickness from 0-0.5 μm. The single crystal layer 1222 is suitable for use as a growth layer during an epitaxial growth process for the formation of epitaxial material 1230. The crystalline layers of the epitaxial material 1230 are an extension of the underlying semiconductor lattice associated with the single crystal layer 1222. The unique CTE matching properties of the engineered substrate 1200 enable growth of thicker epitaxial material 1230 than existing technologies. In some embodiments, the epitaxial material 1230 includes a gallium nitride layer, 2 μm to 10 μm in thickness, which may be utilized as one of a plurality of layers utilized in optoelectronic devices, power devices, and the like. In an embodiment, the bonding layer 1220 includes a single crystal silicon layer that is attached to a silicon oxide barrier layer 1218 using a layer transfer process.

Figure 13:
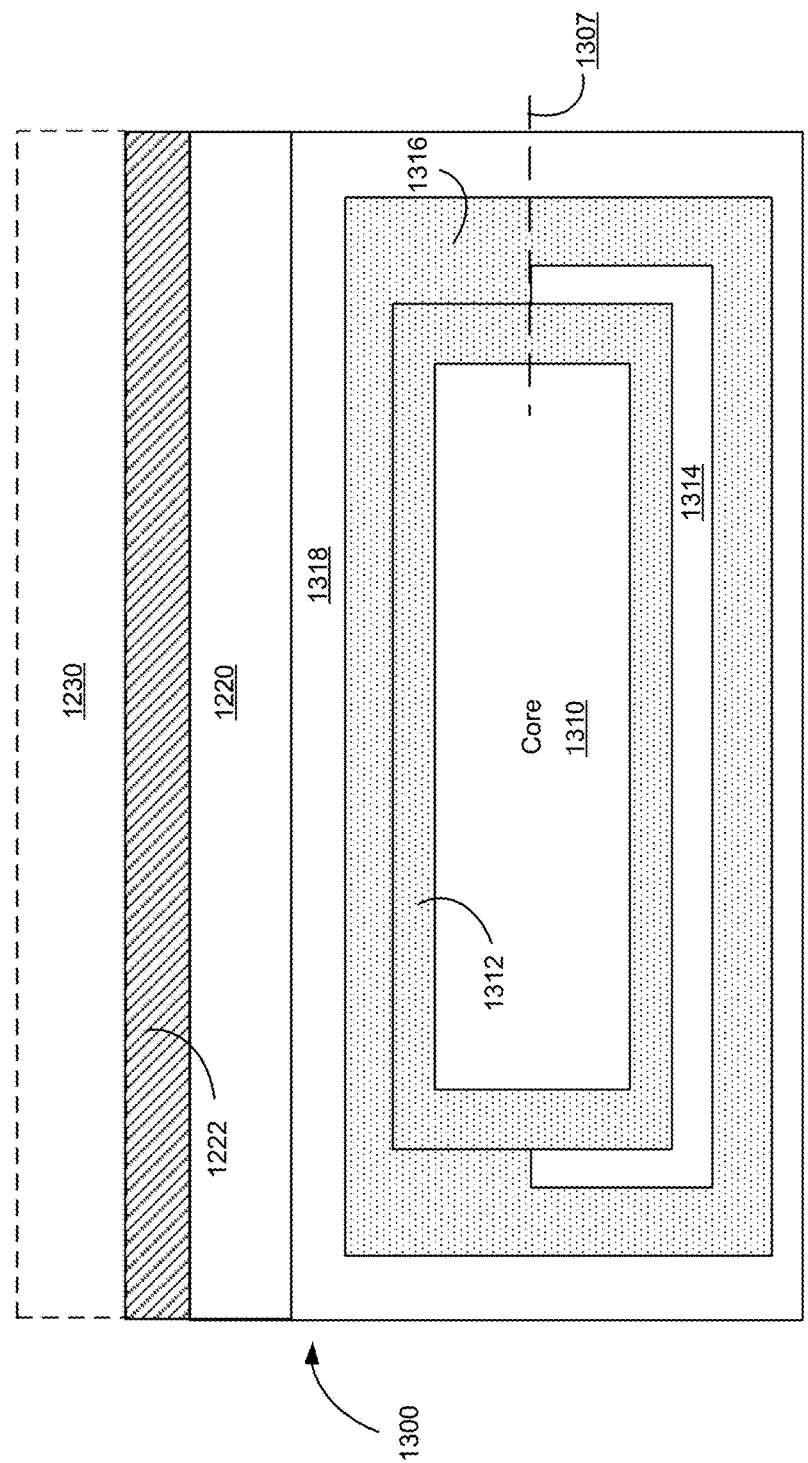
FIG. 13 is a simplified schematic diagram illustrating an engineered substrate structure according to some other embodiments of the present invention.

FIG. 13 is a simplified schematic diagram illustrating an engineered substrate structure 1300 according to an embodiment of the present invention. The engineered substrate 1300 illustrated in FIG. 13 is suitable for a variety of electronic and optical applications. The engineered substrate 1300 includes a core 1310 that may have a coefficient of thermal expansion (CTE) that is substantially matched to the CTE of the epitaxial material 1230 that will be grown on the engineered substrate 1300. The epitaxial material 1230 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 1310 may be a polycrystalline ceramic material, for example, polycrystalline aluminum nitride (AlN). The thickness of the core 1310 may be on the order of 100 to 1,500 µm, for example, 725 µm. The core 1310 is encapsulated in a first adhesion layer 1312 that may be referred to as a shell or an encapsulating shell. In this implementation, the first adhesion layer 1312 completely encapsulates the core, but this is not required by the present invention, as discussed in additional detail with respect to FIG. 14.

In an embodiment, the first adhesion layer 1312 comprises a tetraethyl orthosilicate (TEOS) layer on the order of 1,000 Å in thickness. In other embodiments, the thickness of the first adhesion layer 1312 varies, for example, from 100 Å to 2,000 Å. Although TEOS is utilized for adhesion layers in some embodiments, other materials that provide for adhesion between later deposited layers and underlying layers or materials may be utilized according to an embodiment of the present invention. For example, $SiO_2$, SiON, and the like adhere well to ceramic materials and provide a suitable surface for subsequent deposition, for example, of conductive materials. The first adhesion layer 1312 completely surrounds the core 1310 in some embodiments to form a fully encapsulated core and may be formed using an LPCVD process. The adhesion layer 1312 provides a surface on which subsequent layers adhere to form elements of the engineered substrate structure.

In addition to the use of LPCVD processes, furnace-based processes, and the like to form the encapsulating adhesion layer 1312, other semiconductor processes may be utilized according to embodiments of the present invention. As an example, a deposition process, for example, CVD, PECVD, or the like, that coats a portion of the core 1310 may be utilized, the core 1310 may be flipped over, and the deposition process could be repeated to coat additional portions of the core.

A conductive layer 1314 is formed on at least a portion of the first adhesion layer 1312. In an embodiment, the conductive layer 1314 includes polysilicon (i.e., polycrystalline silicon) that is formed by a deposition process on a lower portion (e.g., the lower half or backside) of the core/adhesion layer structure. In embodiments in which the conductive layer 1314 is polysilicon, the thickness of the polysilicon layer may be on the order of a few thousand angstroms, for example, 3,000 Å. In some embodiments, the polysilicon layer may be formed using an LPCVD process.

In an embodiment, the conductive layer 1314 may be a polysilicon layer doped to provide a highly conductive material, for example, the conductive layer 1314 may be doped with boron to provide a p-type polysilicon layer. In some embodiments, the doping with boron is at a level ranging from about $1 \times 10^{19}$ $cm^{-3}$ to $1 \times 10^{20}$ $cm^{-3}$ to provide for high conductivity. The presence of the conductive layer 1314 is useful during electrostatic chucking of the engineered substrate to semiconductor processing tools, for example tools with electrostatic chucks (ESC). The conductive layer 1314 enables rapid dechucking after processing. Thus, embodiments of the present invention provide substrate structures that may be processed in manners utilized with conventional silicon wafers. One of ordinary skill in the art would recognize many variations, modifications, and alternatives.

A second adhesion layer 1316 (e.g., a second TEOS layer) is formed surrounding the conductive layer 1314 (e.g., a polysilicon layer). The second adhesion layer 1316 is on the order of 1,000 Å in thickness. The second adhesion layer 1316 may completely surround the conductive layer 1314 as well as the first adhesion layer 1312 in some embodiments to form a fully encapsulated structure and may be formed using an LPCVD process. In other embodiments, the second adhesion layer 1316 only partially surrounds the conductive layer 1314, for example, terminating at the position illustrated by plane 1317, which may be aligned with the top surface of the conductive layer 1314. In this example, the top surface of the conductive layer 1314 will be in contact with a portion of barrier layer 1318. One of ordinary skill in the art would recognize many variations, modifications, and alternatives.

A barrier layer 1318 (e.g., a silicon nitride layer) is formed surrounding the second adhesion layer 1316. The barrier layer 1318 is on the order of 4,000 Å to 5,000 Å in thickness in some embodiments. In some embodiments, the barrier layer 1318 completely surrounds the second adhesion layer 1316 to form a fully encapsulated structure and may be formed using an LPCVD process.

In some embodiments, the use of a silicon nitride barrier layer prevents diffusion and/or outgassing of elements present in the core 1310, for example, yttrium oxide (i.e., yttria), oxygen, metallic impurities, other trace elements and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments may be utilized in semiconductor process flows and clean room environments.

Figure 14:
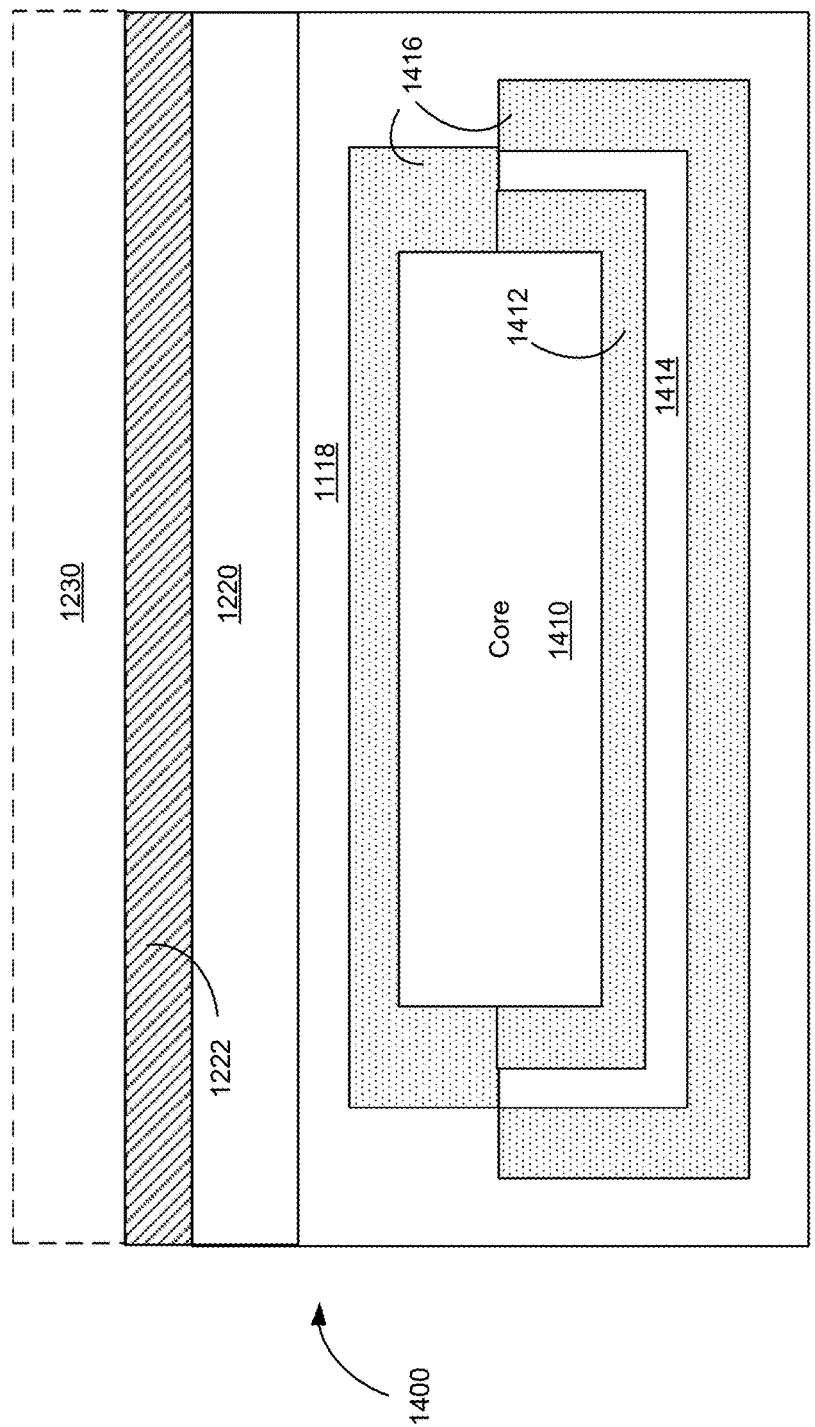
FIG. 14 is a simplified schematic diagram illustrating an engineered substrate structure according to some further embodiments of the present invention.

FIG. 14 is a simplified schematic diagram illustrating an engineered substrate structure according to another embodiment of the present invention. In the embodiment illustrated in FIG. 14, a first adhesion layer 1412 is formed on at least a portion of the core 1410, but does not encapsulate the core 1410. In this implementation, the first adhesion layer 1412 is formed on a lower surface of the core 1410 (the backside of the core 1410) in order to enhance the adhesion of a subsequently formed conductive layer 1414 as described more fully below. Although adhesion layer 1412 is only illustrated on the lower surface of the core 1410 in FIG. 14, it will be appreciated that deposition of adhesion layer material on other portions of the core 1410 will not adversely impact the performance of the engineered substrates structure and such material may be present in various embodiments. One of ordinary skill in the art would recognize many variations, modifications, and alternatives.

The conductive layer 1414 does not encapsulate the first adhesion layer 1412 and the core 1410, but is substantially aligned with the first adhesion layer 1412. Although the conductive layer 1414 is illustrated as extending along the bottom or backside and up a portion of the sides of the first adhesion layer 1412, extension along the vertical side is not required by the present invention. Thus, embodiments may utilize deposition on one side of the substrate structure, masking of one side of the substrate structure, or the like. The conductive layer 1414 may be formed on a portion of one side, for example, the bottom/backside, of the first adhesion layer 1412. The conductive 1414 layer provides for electrical conduction on one side of the engineered substrate structure, which may be advantageous in RF and high power applications. The conductive layer 1414 may include doped polysilicon as discussed in relation to the conductive layer 1314 in FIG. 13.

A portion of the core 1410, portions of the first adhesion layer 1412, and the conductive layer 1414 are covered with a second adhesion layer 1416 in order to enhance the adhesion of the barrier layer 1418 to the underlying materials. The barrier layer 1418 forms an encapsulating structure to prevent diffusion from underlying layers as discussed above.

In addition to semiconductor-based conductive layers, in other embodiments, the conductive layer 1414 is a metallic layer, for example, 500 Å of titanium, or the like.

Referring once again to FIG. 14, depending on the implementation, one or more layers may be removed. For example, layers 1412 and 1414 may be removed, only leaving a single adhesion shell 1416 and the barrier layer 1418. In another embodiment, only layer 1414 may be removed. In this embodiment, layer 1412 may also balance the stress and the wafer bow induced by layer 1220, deposited on top of layer 1418. The construction of a substrate structure with insulating layers on the top side of Core 1410 (e.g., with only insulating layer between core 1410 and layer 1220) will provide benefits for power/RF applications, where a highly insulating substrate is desirable.

In another embodiment, the barrier layer 1418 may directly encapsulate core 1410, followed by the conductive layer 1414 and subsequent adhesion layer 1416. In this embodiment, layer 1220 may be directly deposited onto the adhesion layer 1416 from the top side. In yet another embodiment, the adhesion layer 1416 may be deposited on the core 1410, followed by a barrier layer 1418, and then followed by a conductive layer 1414, and another adhesion layer 1412.

Figure 15:
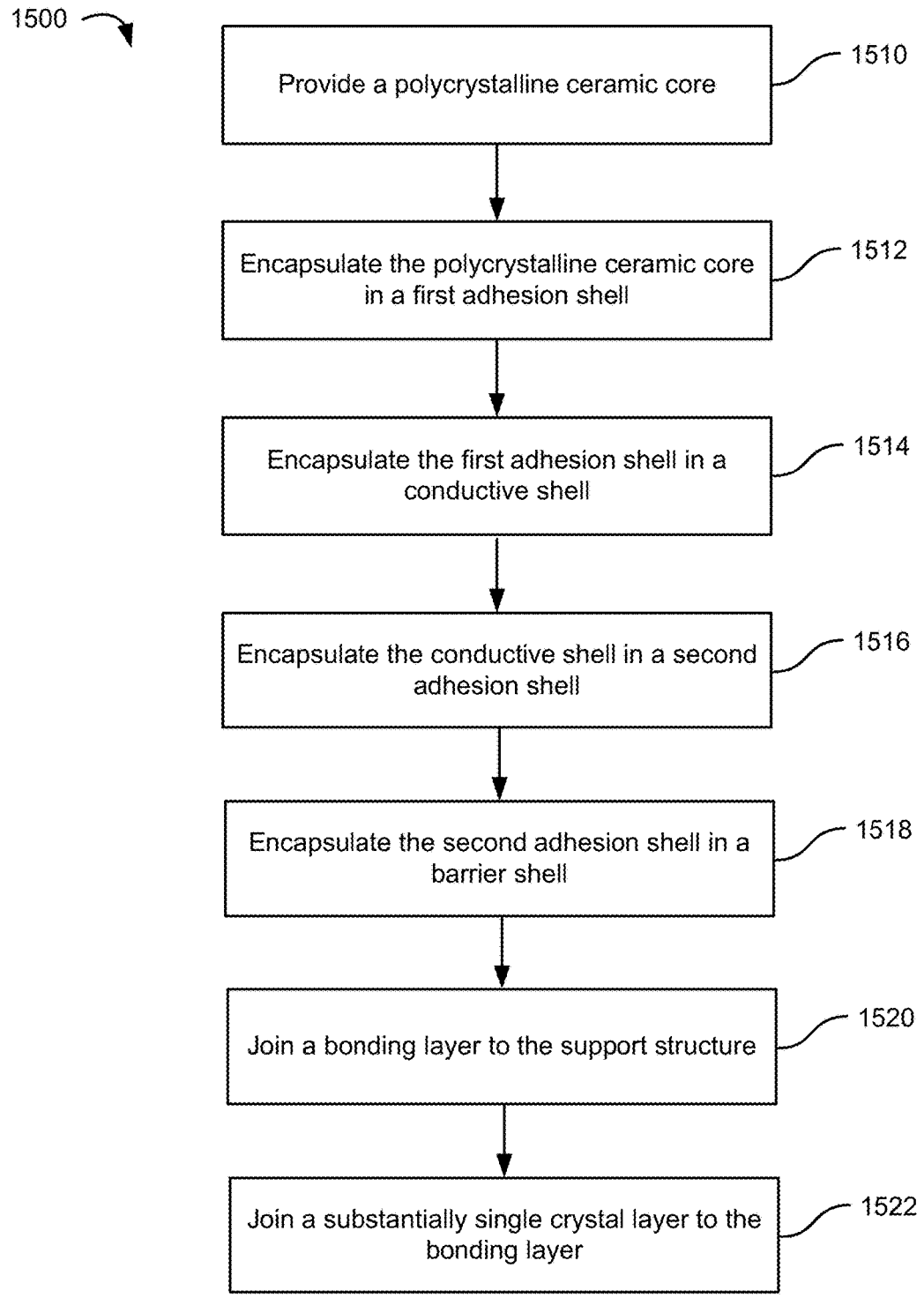
FIG. 15 is a simplified flowchart illustrating a method of fabricating an engineered substrate according to some embodiments of the present invention.

FIG. 15 is a simplified flowchart illustrating a method 1500 of forming a vertical Schottky diode according to an embodiment of the present invention. The method 1500 may be utilized to manufacture a substrate that is CTE matched to one or more of the epitaxial layers grown on the substrate. The method 1500 includes forming a support structure by providing a polycrystalline ceramic core (1510), encapsulating the polycrystalline ceramic core in a first adhesion layer forming a shell (1512) (e.g., a tetraethyl orthosilicate (TEOS) oxide shell), and encapsulating the first adhesion layer in a conductive shell (1514) (e.g., a polysilicon shell). The first adhesion layer may be formed as a single layer of TEOS oxide. The conductive shell may be formed as a single layer of polysilicon.

The method 1500 also includes encapsulating the conductive shell in a second adhesion layer (1516) (e.g., a second TEOS oxide shell) and encapsulating the second adhesion layer in a barrier layer shell (1518). The second adhesion layer may be formed as a single layer of TEOS oxide. The barrier layer shell may be formed as a single layer of silicon nitride.

Once the support structure is formed by processes 1510-1518, the method 1500 further includes joining a bonding layer (e.g., a silicon oxide layer) to the support structure (1520) and joining a substantially single crystal layer, for example, a single crystal silicon layer, to the silicon oxide layer (1522). Other substantially single crystal layers may be used according to embodiments of the present invention, including SiC, sapphire, GaN, AlN, SiGe, Ge, Diamond, $Ga_2O_3$, ZnO, and the like. The joining of the bonding layer may include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 12, the bonding layer 1220 may be formed by a deposition of a thick (e.g., 4 μm thick) oxide layer followed by a chemical mechanical polishing (CMP) process to thin the oxide to approximately 1.5 μm in thickness. The thick initial oxide serves to fill voids and surface features present on the support structure that may be present after fabrication of the polycrystalline core and continue to be present as the encapsulating layers illustrated in FIG. 12 are formed. The oxide layer also serves as a dielectric layer for the devices. The CMP process provides a substantially planar surface free of voids, particles, or other features, which may then be used during a wafer transfer process to bond the single crystal layer 1222 (e.g., a single crystal silicon layer) to the bonding layer 1220. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 1222 (e.g., a single crystal silicon layer) to the bonding layer 1220. In some embodiments, a silicon wafer including the substantially single crystal layer 1222 (e.g., a single crystal silicon layer) is implanted to form a cleavage plane. In this embodiment, after wafer bonding, the silicon substrate may be removed along with the portion of the single crystal silicon layer below the cleavage plane, resulting in an exfoliated single crystal silicon layer. The thickness of the single crystal layer 1222 may be varied to meet the specifications of various applications. Moreover, the crystal orientation of the single crystal layer 1222 may be varied to meet the specifications of the application. Additionally, the doping levels and profile in the single crystal layer may be varied to meet the specifications of the particular application. In some embodiments, the depth of the implant may be adjusted to be greater than the desired final thickness of single crystal layer 1222. The additional thickness allows for the removal of the thin portion of the transferred substantially single crystal layer that is damaged, leaving behind the undamaged portion of the desired final thickness. In some embodiments, the surface roughness may be modified for high quality epitaxial growth. One of ordinary skill in the art would recognize many variations, modifications, and alternatives.

In some embodiments, the single crystal layer 1222 may be thick enough to provide a high quality lattice template for the subsequent growth of one or more epitaxial layers but thin enough to be highly compliant. The single crystal layer 1222 may be said to be "compliant" when the single crystal layer 1222 is relatively thin such that its physical properties are less constrained and able to mimic those of the materials surrounding it with less propensity to generate crystalline defects. The compliance of the single crystal layer 1222 may be inversely related to the thickness of the single crystal layer 1222. A higher compliance may result in lower defect densities in the epitaxial layers grown on the template and enable thicker epitaxial layer growth. In some embodiments, the thickness of the single crystal layer 1222 may be increased by epitaxial growth of silicon on the exfoliated silicon layer.

In some embodiments, adjusting the final thickness of the single crystal layer 1222 may be achieved through thermal oxidation of a top portion of an exfoliated silicon layer, followed by an oxide layer strip with hydrogen fluoride (HF) acid. For example, an exfoliated silicon layer having an initial thickness of 0.5 µm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature may also repair lattice damage.

The silicon oxide layer formed on the top portion of the single crystal layer during thermal oxidation may be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution may range from about 10:1 to about 100:1 for ($SiO2$:Si). A high etch selectivity may reduce the surface roughness by a similar factor from the initial surface roughness. However, the surface roughness of the resultant single crystal layer 152 may still be larger than desired. For example, a bulk Si (111) surface may have a root-mean-square (RMS) surface roughness of less than 0.1 nm as determined by a 2 µm×2 µm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 µm×30 µm AFM scan area.

If the surface roughness of the single crystal layer 1222 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 15 provide a particular method of forming a vertical Schottky diode according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Although some embodiments have been discussed in terms of a layer, the term layer should be understood such that a layer may include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a vertical Schottky diode, the method comprising:
   providing an engineered substrate, the engineered substrate comprising:
   a polycrystalline ceramic core;
   a barrier layer encapsulating the polycrystalline ceramic core;
   a bonding layer coupled to the barrier layer; and
   a substantially single crystalline silicon layer coupled to the bonding layer;
   forming a first epitaxial N-type gallium nitride layer coupled to the substantially single crystalline silicon layer and having a first doping concentration;
   forming a second epitaxial N-type gallium nitride layer coupled to the first epitaxial N-type gallium nitride layer and having a second doping concentration that is lower than the first doping concentration;
   forming a first edge termination region and a second edge termination region coupled to the second epitaxial N-type gallium nitride layer and separated from each other by a portion of the second epitaxial N-type gallium nitride layer;
   forming a Schottky contact coupled to the portion of the second epitaxial N-type gallium nitride layer and to the first edge termination region and the second edge termination region;
   removing the engineered substrate to expose a back surface of the first epitaxial N-type gallium nitride layer; and
   forming an ohmic contact coupled to the back surface of the first epitaxial N-type gallium nitride layer.

2. The method of claim 1 further comprising forming a metal tab attached to the ohmic contact via a solder.

3. The method of claim 1 wherein the second epitaxial N-type gallium nitride layer has a thickness ranging from about 10 µm to about 25 µm.

4. The method of claim 1 wherein forming the first edge termination region and the second edge termination region comprises ion implanting magnesium (Mg) into a first portion and a second portion of the second epitaxial N-type gallium nitride layer.

5. The method of claim 1 further comprising:
   forming a plurality of junction barrier Schottky (JBS) grid regions in the portion of the second epitaxial N-type gallium nitride layer between the first edge termination region and the second edge termination region, wherein the plurality of JBS grid regions is coupled to the Schottky contact.

6. The method of claim 5 wherein forming the plurality of JBS grid regions comprises selective-area doping the portion of the second epitaxial N-type gallium nitride layer by magnesium (Mg) ion implantation.

* * * * *